(12) United States Patent
Hata et al.

(10) Patent No.: US 7,539,009 B2
(45) Date of Patent: May 26, 2009

(54) COOLING UNIT HAVING A HEAT RADIATING PORTION, AND ELECTRONIC APPARATUS INCORPORATING A COOLING UNIT

(75) Inventors: Yukihiko Hata, Hamura (JP); Kentaro Tomioka, Sayama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 418 days.

(21) Appl. No.: 11/116,183

(22) Filed: Apr. 28, 2005

(65) Prior Publication Data

US 2005/0243511 A1 Nov. 3, 2005

(30) Foreign Application Priority Data

Apr. 30, 2004 (JP) ............................... 2004-136727

(51) Int. Cl.
*H05K 7/20* (2006.01)
(52) U.S. Cl. .................... 361/679.47; 361/688; 361/703
(58) Field of Classification Search ................. 361/687, 361/695; 165/121
See application file for complete search history.

(56) References Cited

U.S. PATENT DOCUMENTS

| | | | |
|---|---|---|---|
| 6,118,655 A | 9/2000 | Mecredy et al. | |
| 6,328,097 B1 | 12/2001 | Bookhardt et al. | |
| 6,333,850 B1 | 12/2001 | Pei et al. | |
| 6,343,478 B1 | 2/2002 | Chang | |
| 6,407,916 B1 | 6/2002 | Konstad | |
| 6,654,245 B2 * | 11/2003 | Kawashima et al. | ........ 361/695 |
| 6,778,391 B2 * | 8/2004 | Inoue | .......... 361/695 |
| 6,832,646 B1 * | 12/2004 | Uomori et al. | ............. 165/80.2 |
| 6,900,990 B2 * | 5/2005 | Tomioka | ..................... 361/752 |
| 7,016,195 B2 * | 3/2006 | Ito et al. | ..................... 361/699 |

FOREIGN PATENT DOCUMENTS

| | | |
|---|---|---|
| JP | 08-321571 | 12/1996 |
| JP | 10-209659 | 8/1998 |
| JP | 2003-101272 A | 4/2003 |
| JP | 2003-258472 A | 9/2003 |
| WO | WO 98/52397 | 11/1998 |

OTHER PUBLICATIONS

European Search Report dated Jan. 17, 2007 for Appln. No. 05102968.4-2224.

* cited by examiner

*Primary Examiner*—Lisa Lea-Edmonds
*Assistant Examiner*—Ingrid Wright
(74) *Attorney, Agent, or Firm*—Pillsbury Winthrop Shaw Pittman, LLP

(57) ABSTRACT

The cooling unit includes a heat receiving portion, a heat radiating portion and a circulation path. The heat radiating portion has an impeller, a heat-radiating member and a case. The heat-radiating member surround the impeller that applies cooling air. The heat-radiating member has a coolant passage in which liquid coolant flows, and a plurality of heat-radiating fins which are thermally connected to the coolant passage. The case contains the impeller and the heat-radiating member and has at least one outlet port through which the cooling air is expelled.

21 Claims, 14 Drawing Sheets

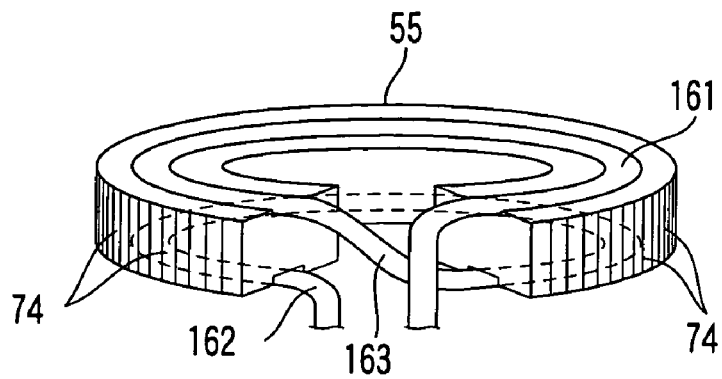
F I G. 23
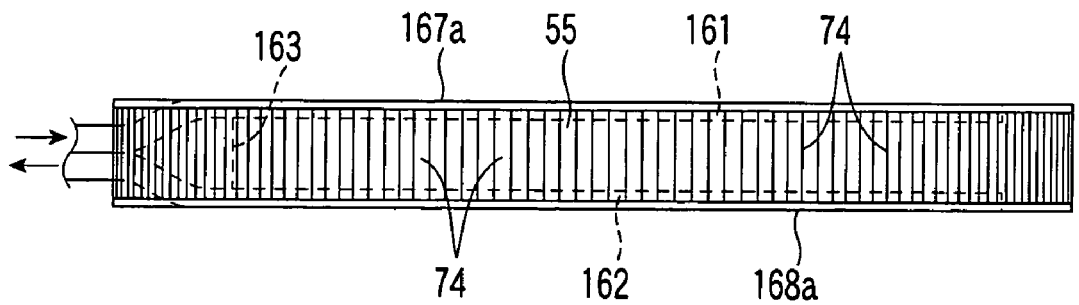
F I G. 24
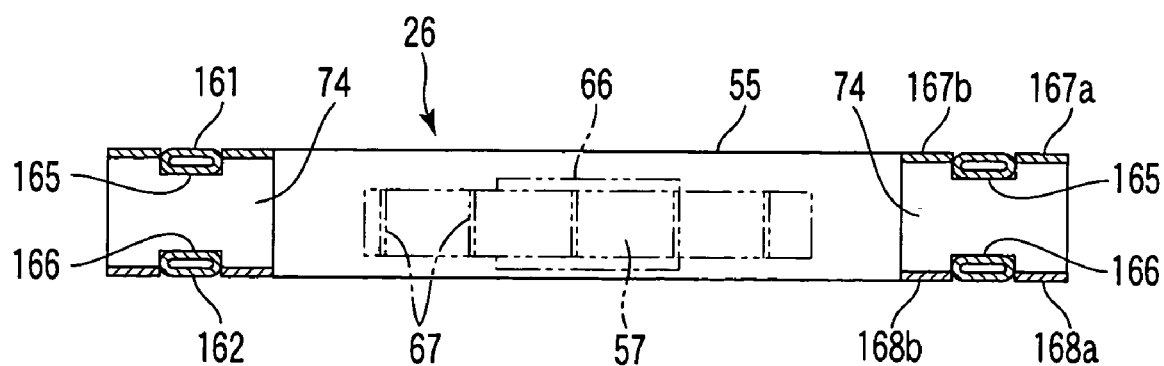
F I G. 25

COOLING UNIT HAVING A HEAT RADIATING PORTION, AND ELECTRONIC APPARATUS INCORPORATING A COOLING UNIT

CROSS-REFERENCE TO RELATED APPLICATIONS

This application is based upon and claims the benefit of priority from prior Japanese Patent Application No. 2004-136727, filed Apr. 30, 2004, the entire contents of which are incorporated herein by reference.

BACKGROUND

1. Field

The present invention relates to a cooling unit of liquid cooling type that uses a radiator to cool a heat generating component (e.g., CPU) with liquid coolant. The invention relates also to an electronic apparatus such as a portable computer, which incorporates the cooling unit.

2. Description of the Related Art

A CPU is incorporated in electronic apparatuses such as portable computers. The heat that a CPU generates while operating is increasing as its data-processing speed rises or as it performs more and more functions. The higher the temperature of the CPU, the less efficiently it operates or the more likely it may fail to operate.

To cool the CPU at high efficiency, cooling systems of so-called "liquid cooling type" have been put to use in recent years. The cooling system uses a liquid coolant whose specific heat is far higher than that of air, in order to cool the CPU.

The conventional cooling system has a heat receiving portion, a heat radiating portion, a coolant passage, and a fan. The heat receiving portion receives heat from a CPU. The heat radiating portion radiates the heat generated by the CPU. The coolant passage is filled with liquid coolant that transfers heat from the heat-receiving portion to the heat-radiating portion. The fan applies cooling air to the heat radiating portion.

The heat radiating portion has a pipe and a plurality of heat-radiating fins. The liquid coolant heated by virtue of heat exchange at the heat-receiving portion flows through the pipe. The heat-radiating fins are arranged in a row, spaced apart from one another. The pipe penetrates the center parts of the heat-radiating fins. It is thermally connected at its outer circumferential surface to the heat-radiating fins, by means of, for example, soldering or the like.

The fan comprises a fan case and an impeller provided in the fan case. The fan case has an outlet port, through which cooling air is discharged. The outlet port opens to the heat radiating portion. The cooling air discharged through the outlet port passes through the gaps between the heat-radiating fins. The cooling air takes away the heat transferred from the liquid coolant via the pipe to heat-radiating fins. The liquid coolant heated at the heat radiating portion is therefore cooled as it exchanges heat with the cooling air. Jpn. Pat. Appln. KOKAI Publications 2003-101272 and 2003-258472, for example, disclose electronic apparatuses that incorporate a cooling unit that has such a heat radiating portion and such a fan.

In the cooling units disclosed in these publications, the heat radiating portion is positioned outside the fan case. The shape of the outlet port of the fan case inevitably limits the size of the heat radiating portion and the number of heat-radiating fins. As a result, the heat radiating portion cannot have a sufficient heat-radiating area. Consequently, the heat radiating portion cannot efficiently radiate the heat generated by the CPU and absorbed into the liquid coolant.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 23 is a perspective view schematically showing the heat-radiating member used in the eighth embodiment;

FIG. 24 is a side view of the heat-radiating member used in the eighth embodiment;

FIG. 25 is a sectional view of the heat-radiating member, taken along line F25-F25 in FIG. 21.

DETAILED DESCRIPTION

A first embodiment of this invention will be described, with reference to FIG. 1 to 13.

Figure 1:
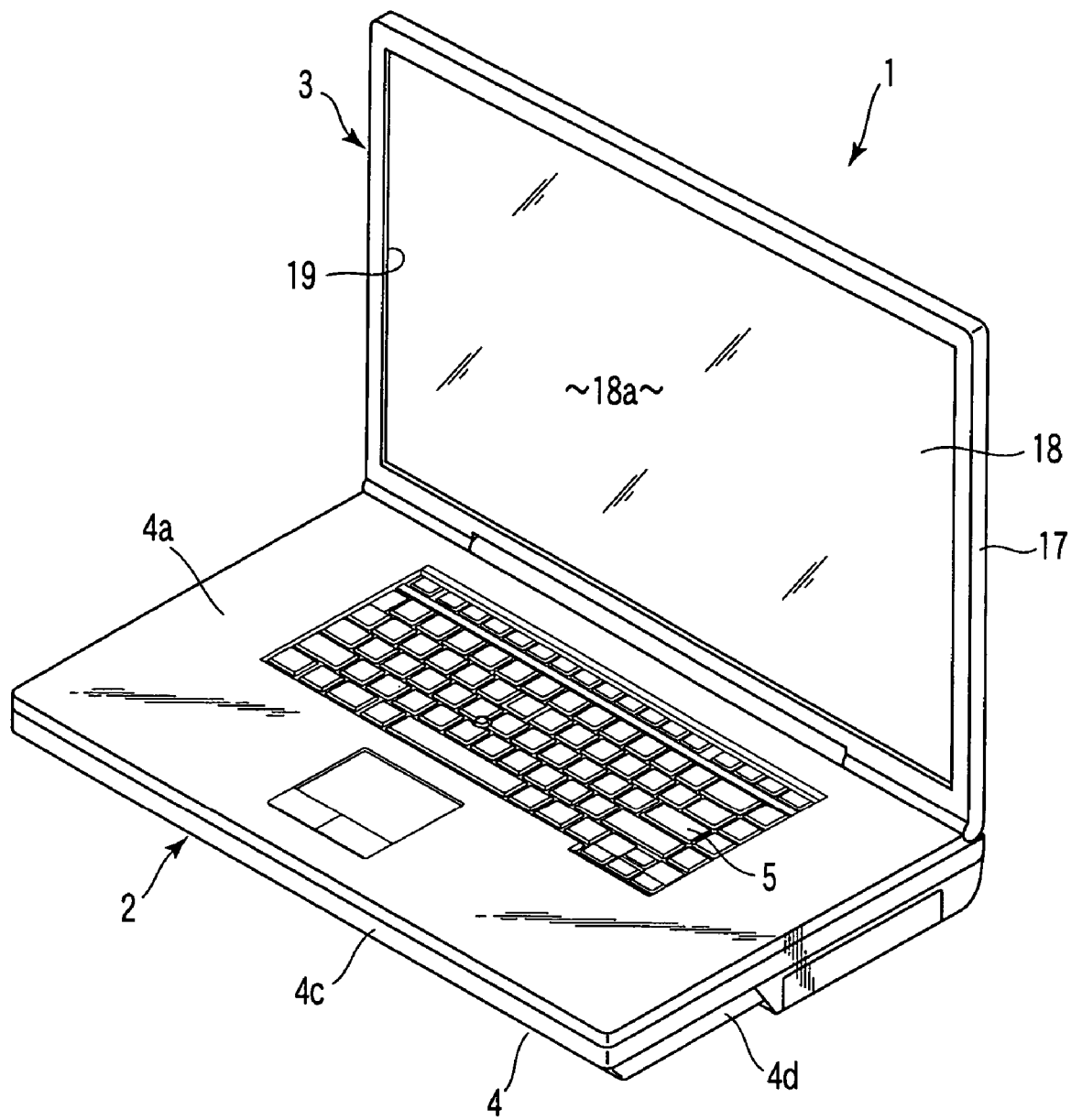
FIG. 1 is a perspective view of a portable computer according to a first embodiment of this invention.
Figure 2:
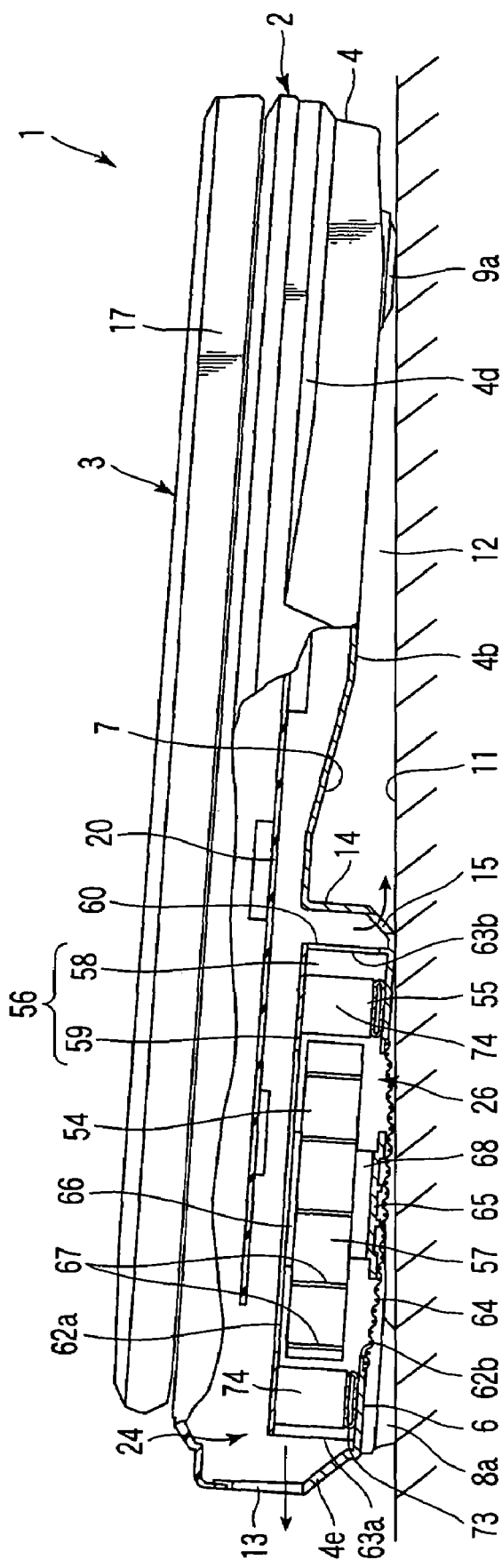
FIG. 2 is a partly sectional, side view of the portable computer according to the first embodiment, showing the internal structure of the main unit containing a cooling unit.
Figure 3:
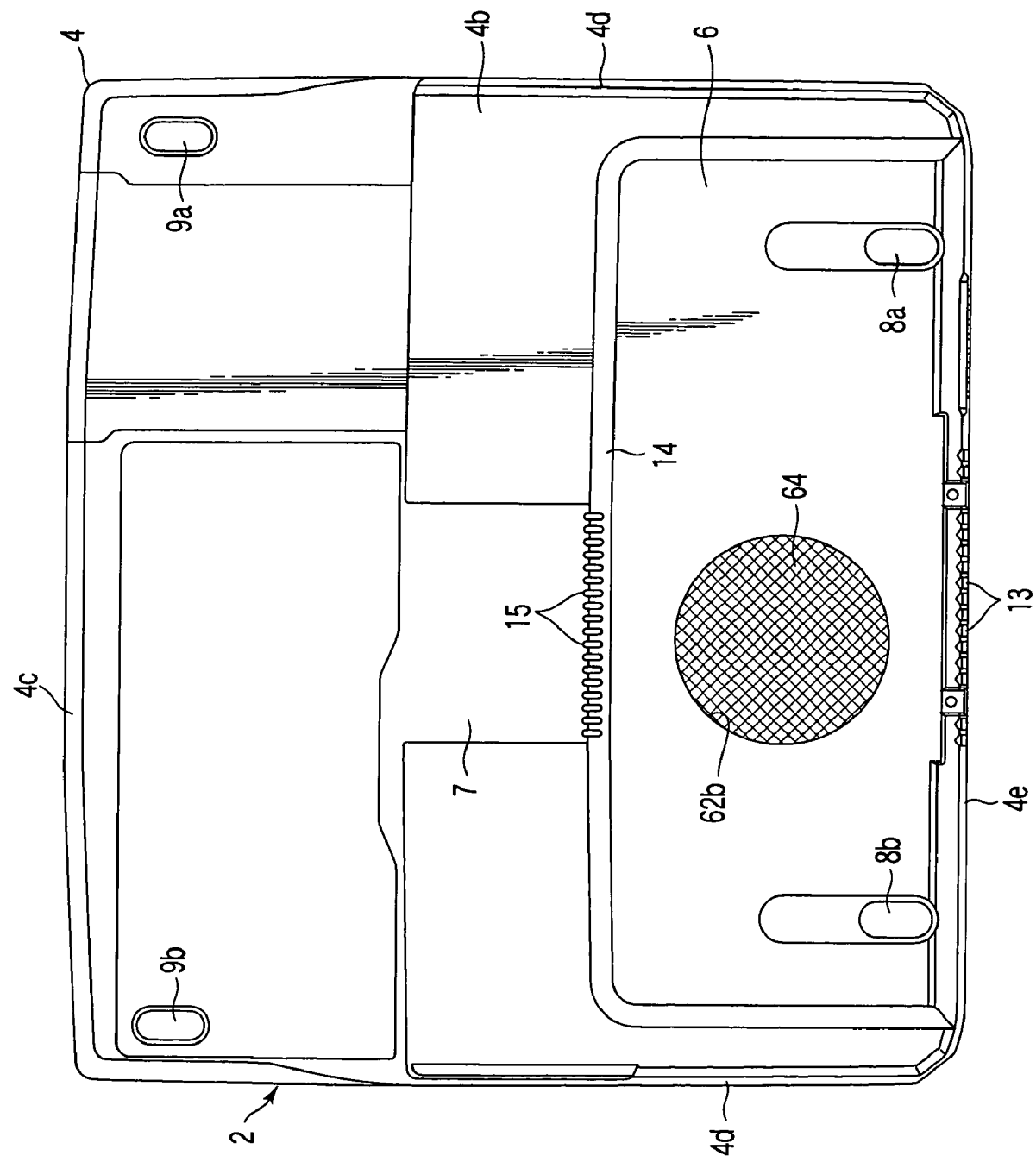
FIG. 3 is a bottom view of the portable computer according to the first embodiment of the invention.

FIGS. 1 to 3 depicts a portable computer 1, which is an electronic apparatus according to this invention. The portable computer 1 comprises a main unit 2 and a display unit 3. The main unit 2 has a first housing 4 shaped like a flat box. The first housing 4 has a top wall 4a, a bottom wall 4b, a front wall 4c, left and right side walls 4d, and a rear wall 4e. The top wall 4a supports a keyboard 5.

At least one of the walls of the first housing 4, e.g., the bottom wall 4b, is made of metal such as magnesium alloy. The bottom wall 4b has a bulging part 6 and a recessed part 7. The bulging part 6 is located at the rear half of the bottom wall 4b. It protrudes downwards, more than the front half of the bottom wall 4b. The recessed part 7 is provided, immediately in front of the bulging part 6, forming a recess in the bottom of the first housing 4. The recessed part 7 extends in the widthwise direction of the housing 4, located at middle with respect to the depth direction of the housing 4.

A pair of first legs 8a and 8b are provided on the bottom of the bulging part 6. Similarly, a pair of second legs 9a and 9b are provided on the front part of the bottom wall 4b. The first legs 8a and 8b are spaced apart in the widthwise direction of the first housing 4. So are the second legs 9a and 9b.

FIG. 2 shows the portable computer 1 put on, for example, the top 11 of a desk. The first legs 8a and 8b and the second legs 9a and 9b contact the top 11. In this condition, the first housing 4 is inclined, with its front edge at a lower level than the rear edge. As a result, a gap 12 is provided between the bulging part 6 and the top 11 of the desk, and another gap 12 between the bottom wall 4b and the top 11 of the desk.

As FIGS. 2 and 3 show, the rear wall 4e of the first housing 4 has a plurality of first exhaust ports 13. The first exhaust ports 13 are arranged in a row, in the widthwise direction of the first housing 4. The bulging part 6 of the first housing 4 has a partition wall 14. The partition wall 14 lies between the bulging part 6 and the recessed part 7. The partition wall 14 has a plurality of second exhaust ports 15. The second exhaust ports 15 are arranged in a row, in the widthwise direction of the first housing 4. They open to the recess defined by the recessed part 7.

The display unit 3 has a second housing 17 and a liquid-crystal display panel 18. The second housing 17 holds the liquid-crystal display panel 18. The liquid-crystal display panel 18 has a screen 18a. The screen 18a is exposed outside the second housing, through the opening 19 made in the front of the second housing 17.

The second housing 17 is hinged to the rear edge of the first housing 4, by means of hinges (not shown). The display unit 3 can therefore be rotated between a closed position and an opened position. At the closed position, the display unit 3 lays on the main unit 2, covering the keyboard 5 from above. At the opened position, the display unit 3 stands on the main unit 2, exposing the keyboard 5 and the screen 18a.

Figure 4:
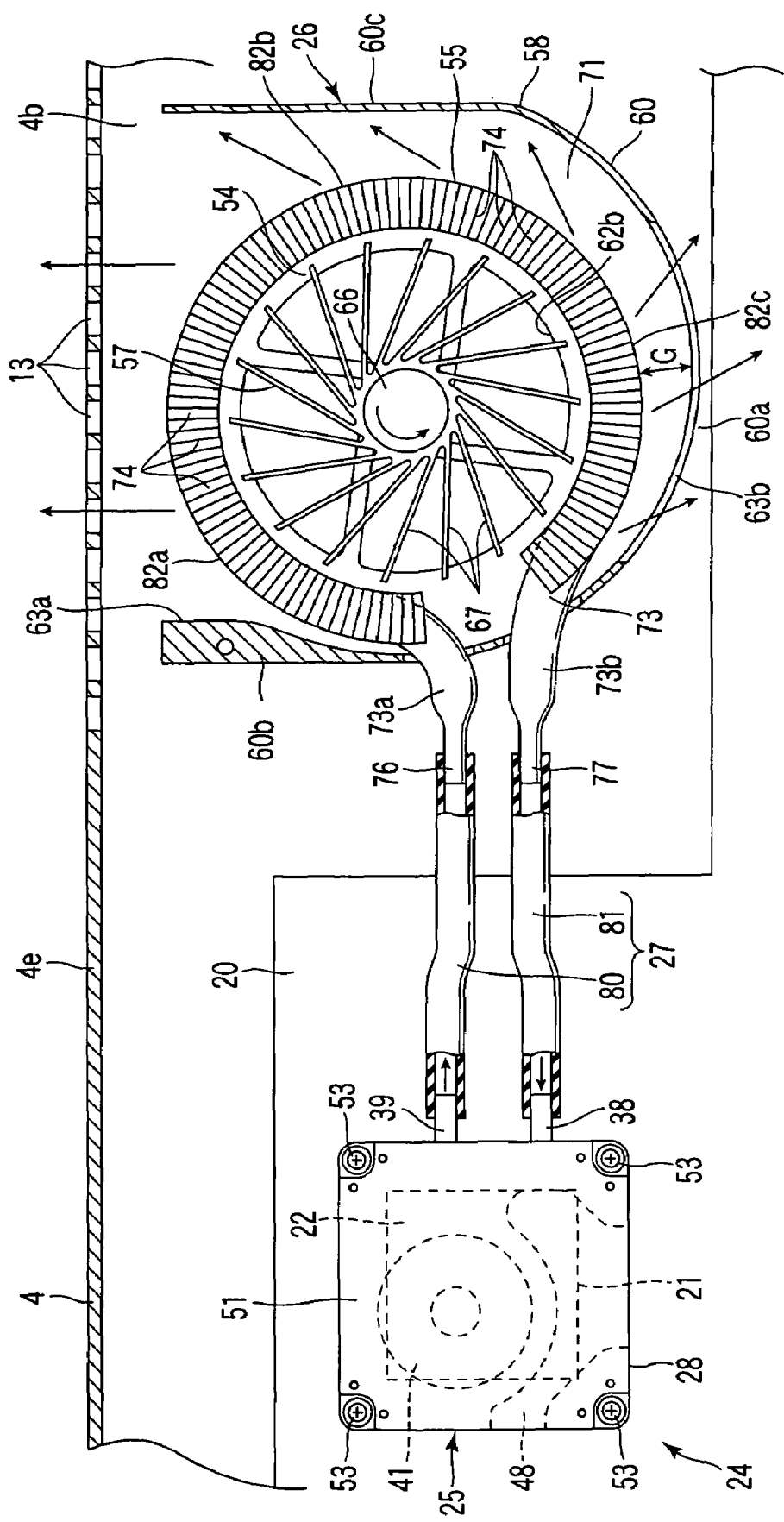
FIG. 4 is a partly sectional, plan view of the cooling unit incorporated in the first embodiment of the invention.
Figure 5:
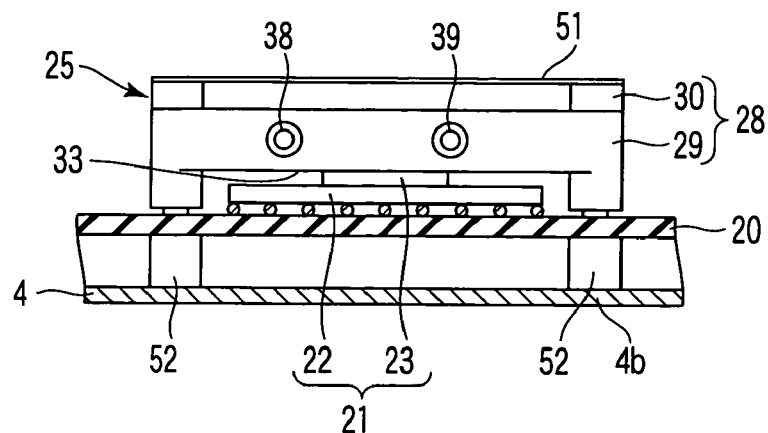
FIG. 5 is a sectional view representing the positional relation between the CPU mounted on the printed circuit board and the pump unit, in the first embodiment of this invention.

As FIGS. 2 and 4 depict, the first housing 4 contains a printed circuit board 20. A CPU 21 is mounted on the printed circuit board 20, at the rear part of the board 20. The CPU 21 is a source of heat in the portable computer 1. The CPU 21 has a base 22 and an IC chip 23. As is shown in FIG. 5, the IC chip 23 is mounted on the center part of the base 22. The IC chip 23 generates much heat as it operates at high speed, performing many functions. The IC chip 23 must be cooled. Otherwise, it would not keep operating well.

As FIG. 4 shows, the first housing 4 contains a cooling unit 24 of liquid cooling type. The cooling unit 24 uses, for example, antifreeze liquid to cool the CPU 21. It comprises a pump unit 25, a radiator 26 and a circulation path 27.

Figure 7:
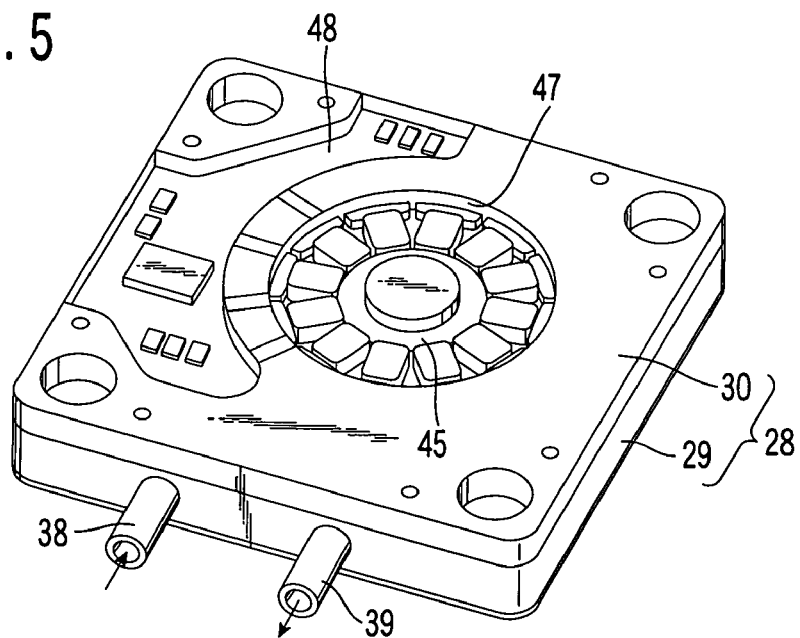
FIG. 7 is a perspective view of the pump housing provided in the first embodiment of this invention.
Figure 6:
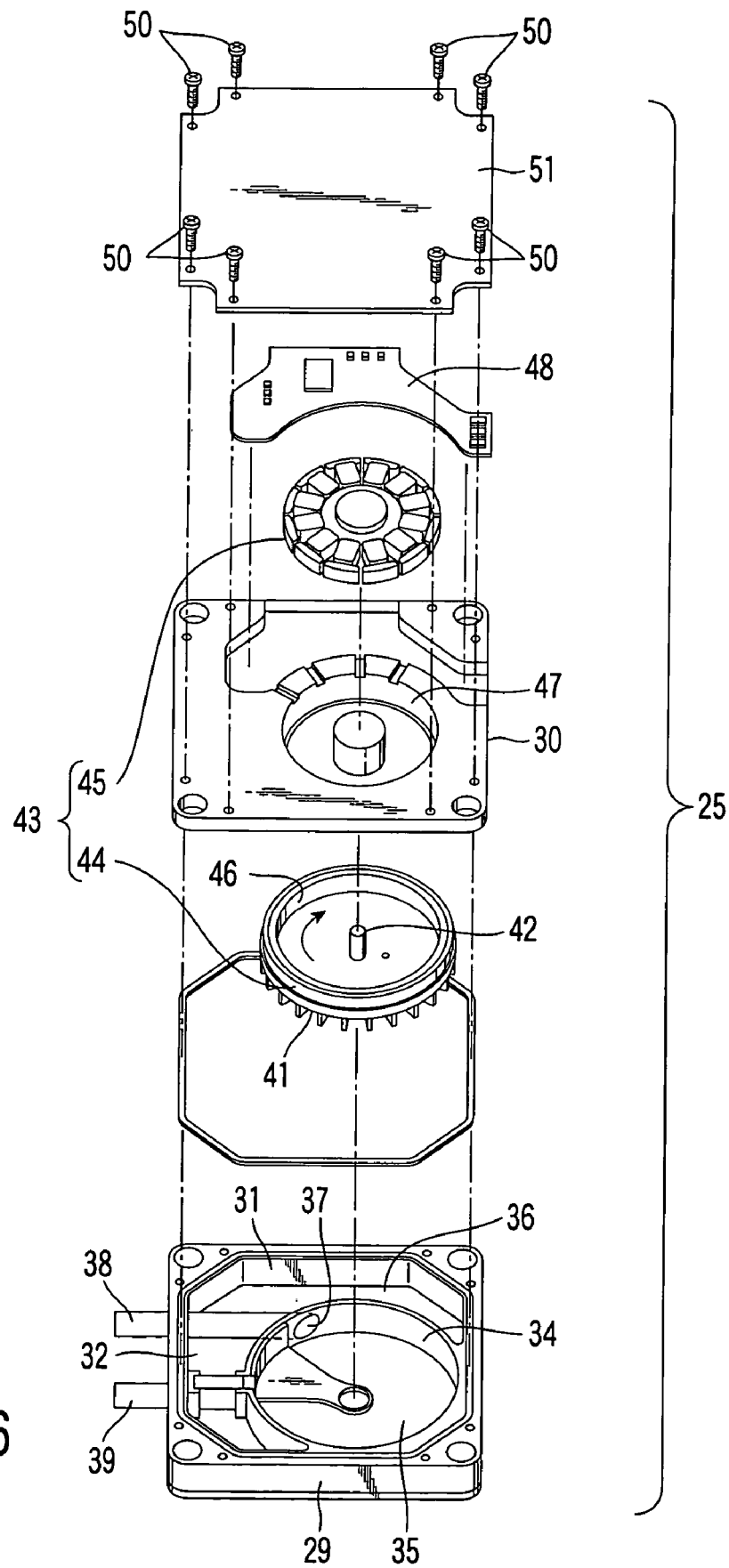
FIG. 6 is an exploded perspective view of the pump unit used in the first embodiment of the invention.

As seen from FIGS. 5 to 7, the pump unit 25 has a pump housing 28 that functions as heat receiving portion, as well. The pump housing 28 is shaped like a flat box and has four corners. It comprises a housing body 29 and a top cover 30. The housing body 29 is a little larger than the CPU 21 and made of metal that excels in thermal conductivity, such as aluminum alloy.

The housing body 29 has a recessed part 31, which opens upwards. A bottom wall 32 of the recessed part 31 is opposed to the CPU 21. The lower surface of the bottom wall 32 is flat, serving as heat-receiving surface 33. The top cover 30 is made of synthetic resin and closes the opening of the recessed part 31.

An annular partition wall 34 divides the interior of the pump housing 28 into a pump chamber 35 and a reserve tank 36. The reserve tank 36 is provided to contain liquid coolant and surrounds the pump chamber 35. The partition wall 34 stands on the bottom wall 32 of the housing body 29. It has a communication hole 37 that connects the pump chamber 35 to the reserve tank 36.

Figure 8:
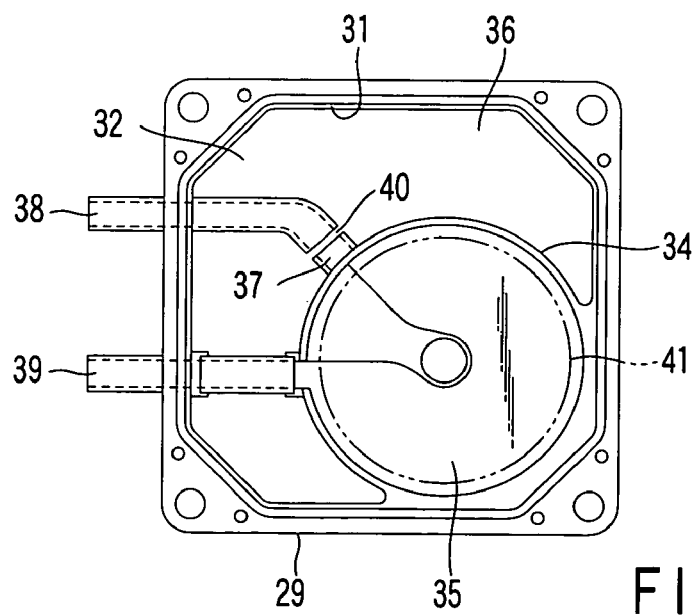
FIG. 8 is a plan view of the pump housing provided in the first embodiment of this invention.

An inlet pipe 38 and an outlet pipe 39 are formed, integrally with the housing body 29. The pipes 38 and 39 extend parallel to each other and spaced apart from each other. The upstream end of the inlet pipe 38 outwardly projects from a side of the housing body 29. The downstream end of the inlet pipe 38 opens to the interior of the reserve tank 36 and faces the communication hole 37 made in the partition wall 34. As FIG. 8 depicts, a gap 40 is provided between the communication hole 37 and the downstream end of the inlet pipe 38. The gap 40 remains below the level of the liquid coolant contained in the reserve tank 36 even if the pump housing 28 changes in position.

The downstream end of the outlet pipe 39 outwardly projects from the side of the housing body 29. The upstream end of the outlet pipe 39 penetrates the partition wall 34 and opens to the pump chamber 35.

In the pump chamber 35 of the pump housing 28, an impeller 41 shaped like a disc is provided. The impeller 41 is mounted on a shaft 42. The shaft 42 extends between the top cover 30 of the pump housing 28 and the bottom wall 32 of the housing body 29.

The pump housing 28 contains a motor 43. The motor 43 is used to rotate the impeller 41. It has a rotor 44 and a stator 45. The rotor 44 is shaped like a ring. The rotor 44 is secured to the top of the impeller 41, in axial alignment with the impeller 41, and is provided in the pump chamber 35. The rotor 44 holds a magnet 46. The magnet 46 has a plurality of positive poles and a plurality of negative poles and can rotate when the rotor 44 and impeller 41 rotate.

The stator 45 is placed in a recess 47 made in the upper surface of the top cover 30. The recess 47 is located in the rotor 44. The stator 45 is therefore held in the-rotor 44, in axial alignment with the rotor 44. The top cover 30 holds a control board 48 on its upper surface. The control board 48 is designed to control the motor 43. It is electrically connected to the stator 45.

Power is supplied to the stator 45 at the same time the power switch of the portable computer 1 is turned on. The power supplied to the stator 45 is converted to a magnetic field, which rotates around the stator 45. The magnetic field acts on the magnet 46 that the rotor 44 holds. As a result, a torque develops between the stator 45 and the magnet 46, causing the rotor 44 to rotate. Hence, the impeller 41 rotates clockwise, as indicated by the arrow in FIG. 6.

Screws 50 secure a back plate 51 to the upper surface of the top cover 30. The back plate 51 covers and conceals the stator 45 and the control board 48.

The pump unit 25 lies on the printed circuit board 20 and covers the CPU 21 from above. As FIG. 5 shows, the pump housing 28 of the pump unit 25 is fastened to the bottom wall 4b, along with the printed circuit board 20. Four bosses 52 project upward from the bottom wall 4b and are located at the four corners of the pump housing 28. The distal end of each boss 52 contacts the printed circuit board 20.

As shown in FIG. 4, pump housing 28 has four holes made in the four corners, respectively. Four screws 53 extend from above, passing through these holes. The screws 53 penetrate the top cover 30, housing body 29 and printed circuit board 20 and are driven in the bosses 52. Thus, the screws 53 fasten the pump unit 25 and the printed circuit board 20 to the bottom wall 4b. In addition, the housing body 29 has its heat-receiving surface 33 thermally coupled to the IC chip 23 of the CPU 21.

Figure 10:
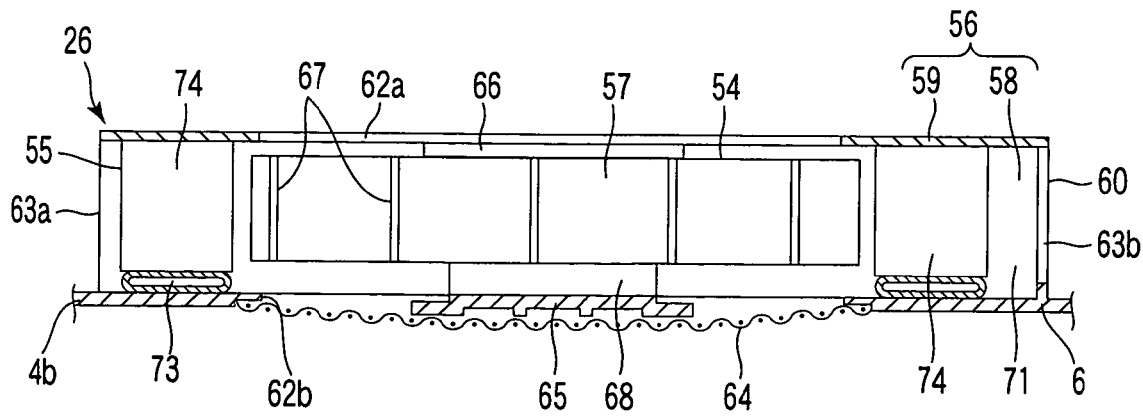
FIG. 10 is a sectional view of the radiator incorporated in the first embodiment of this invention.
Figure 11:
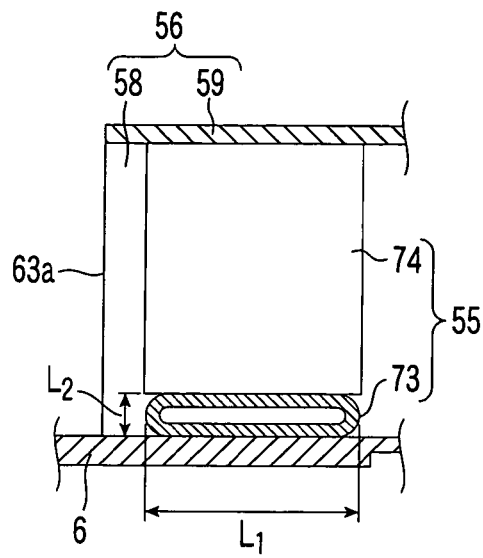
FIG. 11 is a sectional view of the radiator used in the first embodiment, depicting the positional relation between the heat-radiating fins and the coolant passage.
Figure 12:
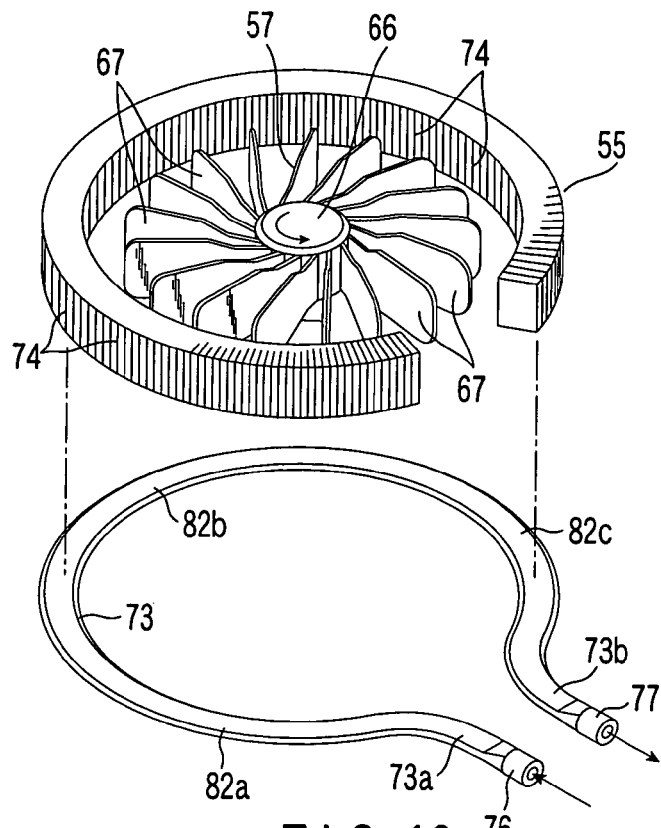
FIG. 12 is an exploded perspective view showing the positional relation that the heat-radiating fins and coolant passage have in the first embodiment of the invention.
Figure 13:
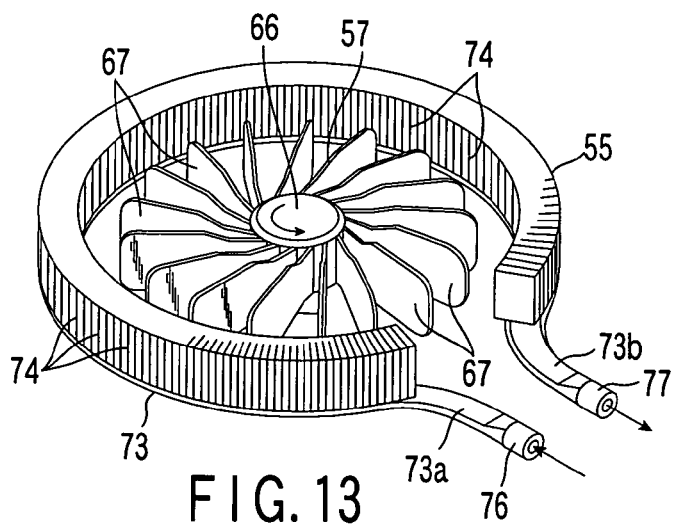
FIG. 13 is a perspective view of the heat-radiating member used in the first embodiment of this invention.

As is illustrated in FIG. 2, the radiator 26 of the cooling unit 24 is provided in the bulging part 6 of the first housing 4. The radiator 26 is a heat-radiating portion. It has a fan 54 and a heat-radiating member 55 as shown in FIG. 10. The fan 54 has a flat case 56 and a centrifugal impeller 57. The case 56 is composed of a main body 58 and a top plate 59. The main body 58 is integrally formed with the bottom wall 4b of the first housing 4.

Figure 9:
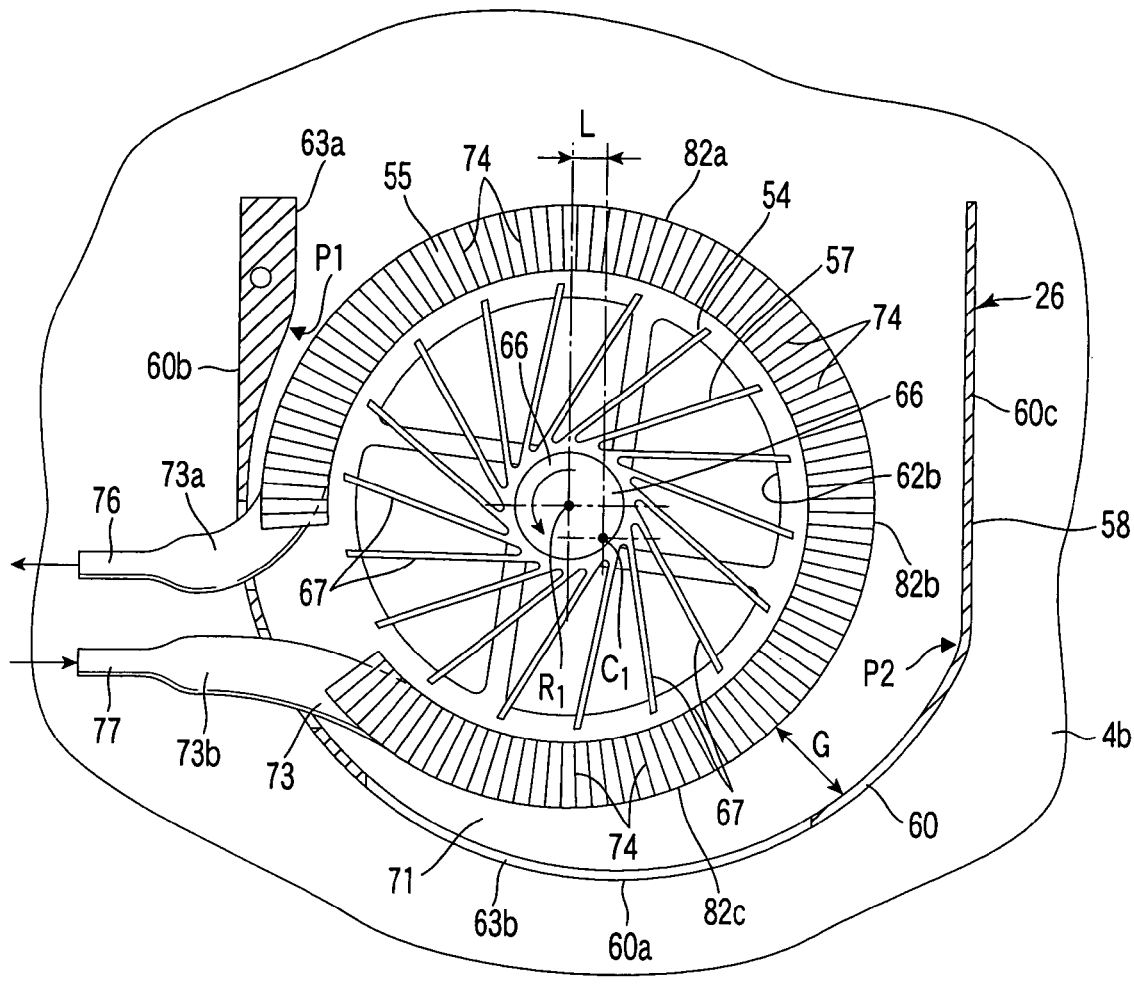
FIG. 9 is a sectional view of the radiator incorporated in the first embodiment, illustrating the positional relation between the impeller, heat-radiating member and case.

In other words, the bulging part 6 has a curved wall 60. As FIG. 9 depicts, the curved wall 60 has three parts 60a, 60b and 60c. The first part 60a is arched. The second part 60b is straight, extending from one end of the first part 60a. The third part 60c is straight, too, extending from the other end of the first part 60a. The first part 60b and the third part 60c are spaced apart and extend parallel to each other. The top plate 59 of the case 56 is fixed to the upper edge of the curved wall 60 and opposed to the bottom of the bulging part 6.

The case 56 has a pair of inlet ports 62a and 62b and a pair of outlet port 63a and 63b. One inlet port 62a opens in the center part of the top plate 59. The other inlet port 62b opens in the bottom of the bulging part 6 and is opposed to the inlet port 62a. A mesh-like guard 64 covers the inlet port 62b. A motor support 65, which is shaped like a disc, is provided in the inlet port 62b.

The outlet ports 63a and 63b are made in the curved wall 60 of the main body 58. One outlet port 63a is defined by the distal edge of the second part 60b, the distal edge of the third part 60c and an edge of top plate 59. The outlet port 63a has an elongated opening that extends in the widthwise direction of the first housing 4. It opens to the first exhaust ports 13 that are made in the rear wall 4e. The other outlet port 63b is made in the first part 60a of the curved wall 60. It faces the outlet port 63a across the center C1 of the case 56. The outlet port 63b opens to the second exhaust ports 15 that are made in the partition wall 14.

The impeller 57 is provided in the case 56. The impeller 57 has a hollow cylindrical boss 66 and a plurality of vanes 67. The vanes 67 extend from the outer circumferential surface of the boss 66, in the radial direction of the boss 66. A flat motor 68 is set in the boss 66 and is supported by the motor support 65 of the main body 58. The impeller 57 is therefore positioned between the inlet port 62a, on the one hand, and the inlet ports 62b, on the other.

The motor 68 rotates the impeller 57 counterclockwise, as the arrow indicates in FIG. 9. As the impeller 57 is so rotated, a negative pressure acts in the inlet ports 62a and 62b. Air is therefore drawn to the center part of the impeller 57 through the inlet ports 62a and 62b. The air thus drawn is expelled from the outer circumference of the impeller 57 in the radial direction, by virtue of a centrifugal force.

The impeller 57 has a rotational center R1. The center R1 is deviated from the center C1 of the case 56 by distance L, approaching the second part 60b of the curved wall 60.

A gap G is provided between the outer circumference of the impeller 57 and the curved wall 60 of the case 56. The gap G gradually increases in the rotational direction of the impeller 57, due to the eccentricity of the impeller 57. The gap G defines a spiral chamber 71 in the case 56. The spiral chamber 71 surrounds the impeller 57. The chamber 71 is designed to collect the air coming from the outer circumference of the impeller 57 and apply the air toward the outlet ports 63a and 63b. The chamber 71 converts the velocity energy of the air to pressure energy.

As FIG. 9 shows, the shape of the spiral chamber 71 is defined by the first part 60a of the curved wall 60. The chamber 71 has a starting position P1 and an ending position P2. The starting position P1 is positioned at the second part 60b of the curved wall 60 and adjacent to one end of one outlet port 63a. The ending position P2 is deviated from the starting position P1 in the rotational direction of the impeller 57, by a predetermined angle. The gap G between the outer circumference of the impeller 57 and the curved wall 60 is the narrowest at the starting position P1, gradually increasing from the starting position P1 to the ending position P2.

The heat-radiating member 55 of the radiator 26 is arranged between the impeller 57 and the curved wall 60 of the case 56 and exposed to the spiral chamber 71. As shown in FIGS. 9 to 13, the heat-radiating member 55 has a coolant passage 73 and a plurality of heat-radiating fins 74. The coolant passage 73 is, for example, a copper pipe having a flat cross section. The cross section of the passage 73 has a major axis L1 and a minor axis L2. The coolant passage 73 is shaped like a ring, is coaxial with the impeller 57 and surrounds the impeller 57. The coolant passage 73 is laid on the bottom of the bulging part 6, with the minor axis L2 extending in the direction of thickness of the first housing 4. The coolant passage 73 is therefore thermally coupled to the first housing 4.

The coolant passage 73 has an upstream end 73a and a downstream end 73b. The upstream end 73a and downstream end 73b extend outwards in the radial direction of the impeller 57 and in parallel to each other. The upstream end 73a of the coolant passage 73 has a circular cross section and serves as coolant inlet port 76 into which the coolant flows. Similarly, the downstream end 73b of the coolant passage 73 has a circular cross section. The downstream end 73b serves as coolant outlet port 77 from which the coolant is discharged.

The coolant inlet port 76 and coolant outlet port 77 of the coolant passage 73 extend from the case 56. To be more specific, they are located between the starting position P1 and ending position P2 in the spiral chamber 71, penetrate the first part 60a of the curved wall 60 and extends from the case 56. Hence, the coolant inlet port 76 and the coolant outlet port 77 project from the case 56, at a position near the starting position P1 in the spiral chamber 71, where the gap G between the curved wall 60 and the outer circumference of the impeller 57.

Each of the heat-radiating fins 74 is a rectangular plate and made of metal material that excels in thermal conductivity, such as aluminum alloy. The heat-radiating fins 74 extend in the radial direction of the impeller 57 and are spaced apart from one another in the circumferential direction of the impeller 57.

The heat-radiating fins 74 stand upright, in the direction of thickness of the first housing 4. The fins 74 are secured at lower end to the upper surface of the coolant passage 73, by means of, for example, soldering. Therefore, the heat-radiating fins 74 are spaced apart by a specific distance and thermally coupled to the coolant passage 73. The heat-radiating fins 74 are thermally coupled at upper end to the top plate 59 of the case 56.

As FIG. 4 depicts, the circulation path 27 of the cooling unit 24 has a first tube 80 and a second tube 81. The first tube 80 connects the outlet pipe 39 of the pump housing 28 to the coolant inlet port 76 of the coolant passage 73. The second tube 81 connects the inlet pipe 38 of the pump housing 28 to the coolant outlet port 77 of the coolant passage 73.

Namely, the coolant passage 73 of the heat-radiating member 55 functions as passage that connects the first tube 80 and second tube 81. Thus, the liquid coolant circulates between the pump unit 25 and the radiator 26, through the first tube 80, second tube 81 and coolant passage 73.

As illustrated in FIG. 4, the coolant passage 73 has first to third heat-radiating regions 82a to 82c. The first heat-radiating region 82a is the region to which the liquid coolant at high temperature flows from the first tube 80. The upstream end 73a of the coolant passage 73 lies in the first heat-radiating region 82a. The first heat-radiating region 82a is therefore at a higher temperature than any other heat-radiating region. The first heat-radiating region 82a extends from the second part 60b of the curved wall 60 toward the outlet port 63a and is opposed to this outlet port 63a.

The second heat-radiating region 82b of the coolant passage 73 is located at the downstream of the first heat-radiating region 82a. The second heat-radiating region 82b faces the third part 60c of the curved wall 60 and lies in the spiral chamber 71, at the broadest part of the gap G between the impeller 57 and the curved wall 60.

The third heat-radiating region 82c of the coolant passage 73 is located at the downstream of the second heat-radiating region 82b. The downstream end 73b of the coolant passage 73 lies in the third heat-radiating region 82c. The third heat-radiating region 82c is therefore at a lower temperature than any other heat-radiating region. The third heat-radiating region 82c extends along the first part 60a of the curved wall 60 and is opposed to the outlet port 63b.

How the cooling unit 24 operates will be explained.

While the portable computer 1 is operating, the IC chip 23 of the CPU 21 generates heat. The heat the IC chip 23 generates propagates to the pump housing 28 through the heat-receiving surface 33. The pump chamber 35 and the reserve tank 36, both provided in the pump housing 28, are filled with liquid coolant. The liquid coolant therefore absorbs most of the heat transmitted to the pump housing 28.

Power is supplied to the stator 45 of the motor 43 at the same time the power switch on the portable computer 1 is turned on. A torque develops between the stator 45 and the magnet 46 held by the rotor 44. The torque drives the rotor 45, which rotates the impeller 41. As the impeller 41 is rotated, a pressure is applied to the liquid coolant in the pump chamber 35. The liquid coolant is forced out through the outlet pipe 39. The liquid coolant then flows into the radiator 26 through the first tube 80.

More precisely, the liquid coolant heated by virtue of heat exchange in the pump housing 28 is supplied via the coolant inlet port 76 into the coolant passage 73. The coolant flows through the coolant passage 73 toward the coolant outlet port 77. While the coolant is so flowing, the heat generated by the IC chip 23 is transferred to the coolant passage 73 and thence to the heat-radiating fins 74.

In the first embodiment, the coolant passage 73 is thermally coupled to the bulging part 6. The heat transferred from the liquid coolant to the coolant passage 73 therefore diffuses in the first housing 4, due to heat conduction to the first housing 4. In addition, the heat-radiating fins 74 radiate the heat transferred to them from the liquid coolant, to the top plate 59 of the case 56. This is because the fins 74 are thermally connected to the top plate 59. Thus, the surfaces of the first housing 4 and the surface of the top plate 59 can be utilized as heat-radiating surfaces. This helps to enhance the heat-radiating ability of the radiator 26.

When the impeller 57 of the radiator 26 is rotated while the portable computer 1 is operating, it applies air in its radial direction. The air thus applied is cooling air, which flows through the gap between any two adjacent heat-radiating fins 74. The fins 74 and the coolant passage 73 are cooled. In other words, the cooling air takes most of the heat away from the fins 74 and passage 73.

The cooling air coming out through the gaps between the heat-radiating fins 74 flows into the spiral chamber 71 that is provided in the case 56. The spiral chamber 71 converts the velocity energy of the air to pressure energy. Therefore, the pressure in the spiral chamber 71 gradually increases from the starting position P1 to the ending position P2. As a result, the flow rate of air is high at the outlet ports 63a and 63b of the case 56. The cooling air that has cooled the heat-radiating member 55 can therefore be discharged from the case 56 at high efficiency.

The outlet port 63a of the case 56 faces the first exhaust ports 13 of the first housing 4. The other outlet port 63b of the case 56 faces the second exhaust ports 15 of the first housing 4. Hence, the cooling air discharged through the outlet port 63a flows toward the back of the first housing 4 via the first exhaust ports 13, as indicated by the arrow shown in FIG. 2. The cooling air discharged through the other outlet port 63b flows toward the bottom wall 4b of the first housing 4 via the second exhaust ports 15.

The second exhaust ports 15 remain open to the gap 12 between the bottom wall 4b and the top 11 of the desk, as long as the portable computer 11 is placed on the top 11. The cooling air discharged through the second exhaust ports 15 flows outside the first housing 4 through the gap 12. Thus, the top 11 of the desk would not block the stream of cooling air.

The liquid coolant that has been cooled by virtue of heat exchange in the radiator 26 flows through the second tube 81, from the coolant outlet port 77 to the inlet pipe 38 of the pump housing 28. The liquid coolant is supplied from the downstream end of the inlet pipe 38 into the reserve tank 36 through the gap 40. Bubbles, if any in the liquid coolant flowing through the coolant passage 73, can be removed from the coolant in the reserve tank 36.

The liquid coolant is drawn from the reserve tank 36 into the pump chamber 35 via the communication hole 37. A pressure is applied to the liquid coolant in the pump chamber 35. The liquid coolant is therefore supplied back into the radiator 26 through the outlet pipe 39.

This cooling cycle is repeated, transferring the heat of the IC chip 23 to the heat-radiating member 55 of the radiator 26. The heat is radiated from the portable computer 1 as the cooling air flows through the gaps between the heat-radiating fins 74 of the heat-radiating member 55.

In the radiator 26 configured as described above, the coolant passage 73 through which the hot liquid coolant flows surrounds the impeller 57 of the fan 54 and is thermally connected to the heat-radiating fins 74. The heat-radiating fins 74 extend in the radial direction of the impeller 57. The cooling air coming from the entire circumference of the impeller 57 can therefore efficiently cool the coolant passage 73 and the heat-radiating fins 74.

The heat-radiating member 55 can therefore radiate the heat of the IC chip 23, which the liquid coolant has absorbed, from the entire circumference of the impeller 57.

The impeller 57 and the heat-radiating member 55 are provided in the case 56 that has outlet ports 63a and 63b. The cooling air applied from the circumference of the impeller 57 pass first through the gaps between the heat-radiating fins 74 of the heat-radiating member-55 and then through the first exhaust ports 13 and second exhaust ports 15 of the first housing 4. Finally, the cooling air is discharged from the portable computer 1. Therefore, the case 56 can determine the direction in which to discharge the cooling air that has been heated by virtue of heat exchange in the radiator 26. This makes it possible to discharge the hot cooling air from the first housing 4 at high efficiency, without circulating it around the radiator 26.

In the first embodiment, the impeller 57 is so positioned that its rotational center R1 is deviated from the center C1 of the case 56. The spiral chamber 71 is thereby provided in the case 56. The spiral chamber 71 converts the velocity energy of the air to pressure energy. Therefore, the cooling air that has cooled the heat-radiating member 55 can be discharged at high efficiency from the case 56 through the outlet ports 63a and 63b of the case 56.

The coolant passage 73 of the radiator 26 has a first heat-radiating region 82a, to which the liquid coolant heated by virtue of heat exchange in the pump housing 28 flows first. The first heat-radiating region 82a opposes the outlet port 63a of the case 56. The hot liquid coolant therefore flows toward the outlet port 63a after it is guided to the coolant passage 73. As a result, the cooling air that has cooled the first heat-radiating region 82a, i.e., the region at the highest temperature in the coolant passage 73, is discharged from the first housing 4 through the outlet port 63a and the first exhaust ports 13, without flowing in the case 56.

Hence, the influence that the heat of the coolant passage 73 may impose on the case 56 can be minimized. This serves to enhance the heat-radiating efficiency of the radiator 26.

In the radiator 26 described above, the heat-radiating member 55 is provided in the case 56 of the fan 54 and surrounds the impeller 57. The heat-radiating member 55 and the impeller 57 are thus held in the case 56, forming a single unit. The member 55 and the impeller 57 therefore assume as precise a positional relation as desired. As a result, the cooling air coming from the outer circumference of the impeller 57 can be uniformly applied to the heat-radiating member 55. This also serves to enhance the heat-radiating efficiency of the radiator 26.

Additionally, in the radiator 26, the coolant inlet port 76 and coolant outlet port 77 of the coolant passage 73 extend from the case 56, passing the starting position P1 of the spiral chamber 71, where the gap G between the curved wall 60 of the case 56 and the outer circumference of the impeller 57 is narrowest. Therefore, neither the coolant inlet port 76 nor the coolant outlet port 77 extends across the that part of the spiral chamber 71, at which the cooling air develops a high pressure. This reduces the resistance to the cooling air, making it possible to discharge the air at high efficiency.

Figure 14:
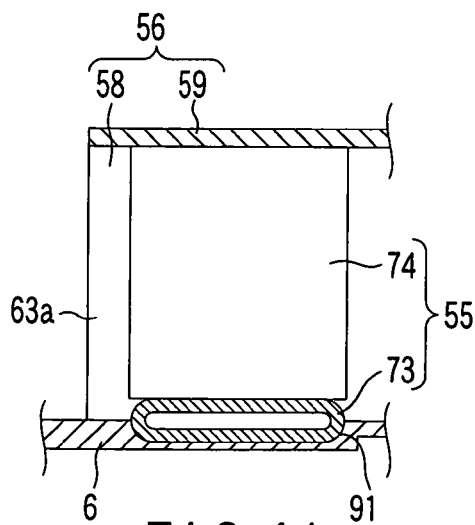
FIG. 14 is a sectional view of the radiator incorporated in a second embodiment of the invention, illustrating the positional relation between the heat-radiating fins and the coolant passage.

This invention is not limited to the first embodiment described above. FIG. 14 illustrates a second embodiment of the invention.

In the second embodiment, the bottom of the bulging part 6 of the first housing 4 has a groove 91. The groove 91 is shaped like an arc, extending along the coolant passage 73. The coolant passage 73 is fitted in the groove 91 and soldered to the bottom of the groove 91.

In the second embodiment, the coolant passage 73 is precisely positioned with respect to the main body 58 of the case 56. This helps to increase the efficiency of assembling the radiator 26. Moreover, the bulging part 6 and the coolant passage 73 contact at a large area. The heat of the liquid coolant, transmitted to the coolant passage 73, can therefore be efficiently transferred to the first housing 4 through the bulging part 6.

Figure 15:
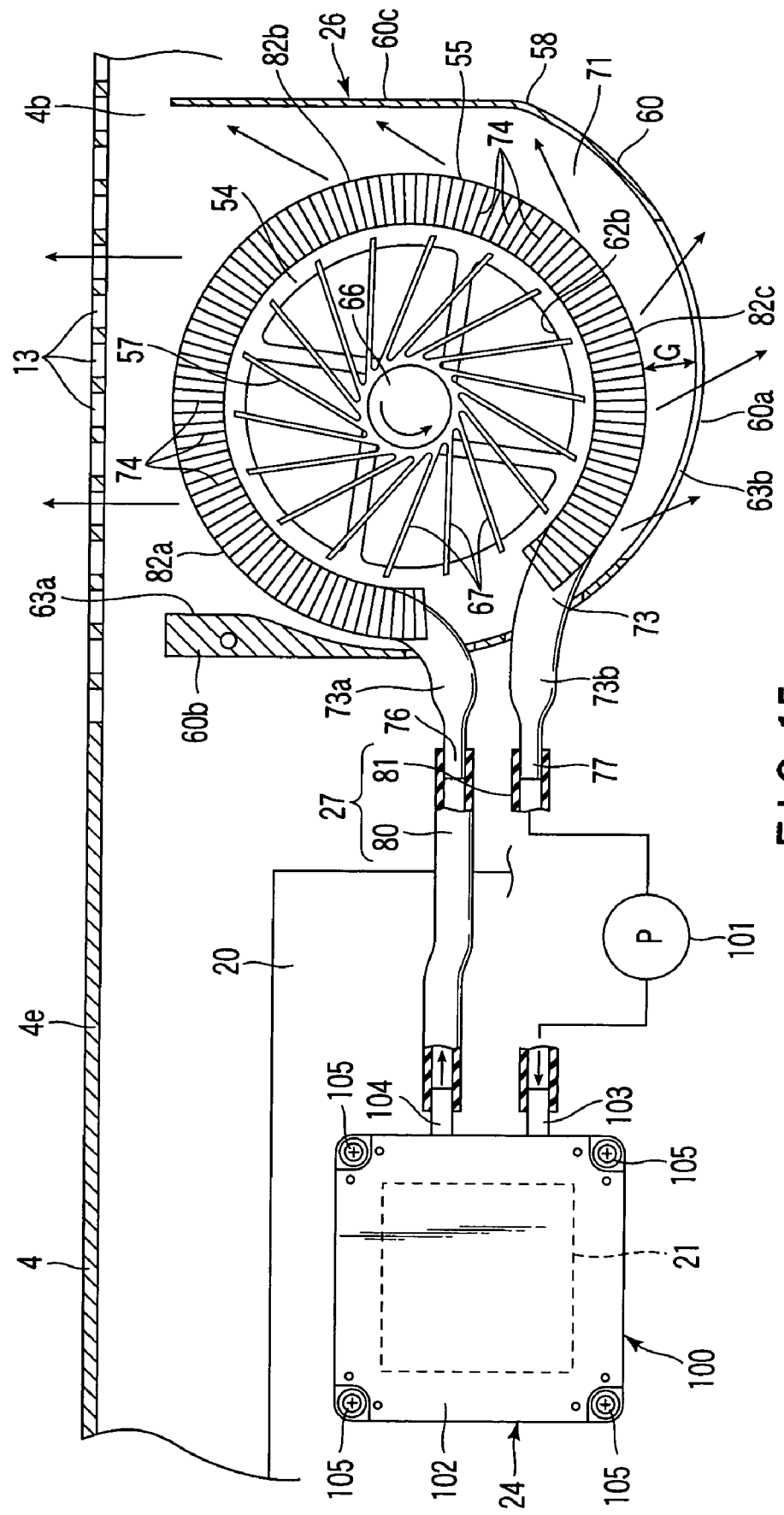
FIG. 15 is a partly sectional, plan view of the cooling unit incorporated in a third embodiment of the present invention.

FIG. 15 shows a third embodiment of the present invention.

The third embodiment differs from the first embodiment in that a heat-receiving portion 100 for absorbing the heat of the CPU 21 and a pump 101 for applying a pressure on liquid coolant to force the coolant out are separated from each other. The third embodiment is identical to the first embodiment in any other structural respects. Thus, the components identical to those of the first embodiment are designated at the same reference numerals and will not be described.

As FIG. 15 depicts, the heat-receiving portion 100 has a housing 102. The housing 102 is shaped like a flat square box and has four corners. The housing 102 is somewhat larger than the CPU 21. The housing 102 has a heat-receiving chamber (not shown), in which liquid coolant may flow. The housing 102 has a coolant inlet port 103 and a coolant outlet port 104. The ports 103 and 104 open to the heat-receiving chamber and project from one side of the housing 102.

The housing 102 lies on the printed circuit board 20 and covers the CPU 21 from above. The housing 102 is fastened to the printed circuit board 20 by means of screws 105. Thus, the housing 102 is thermally connected to the CPU 21. The liquid coolant flowing in the housing 102 absorbs heat from the CPU 21.

The first tube 80 of the circulation path 27 connects the coolant outlet port 104 of the heat-receiving portion 100 to the coolant inlet port 76 of the heat-radiating member 55. The pump 101 is provided on the middle part of the second tube 81. Thus, the liquid coolant circulates between the heat-receiving portion 100 and the radiator 26 through the first tube 80 and the second tube 81.

In the third embodiment, the liquid coolant heated by virtue of heat exchange at the heat-receiving portion 100 can be guided to the coolant passage 73 of the radiator 26. This achieves the same advantage as in the first embodiment.

In the third embodiment, the pump 101 is provided on the second tube 81. Nevertheless, the position of the pump 101 is not limited to this. Instead, the pump 101 may be provided on, for example, the first tube 80 that guides the liquid coolant heat at the heat-receiving portion 100 to the radiator 26.

Figure 16:
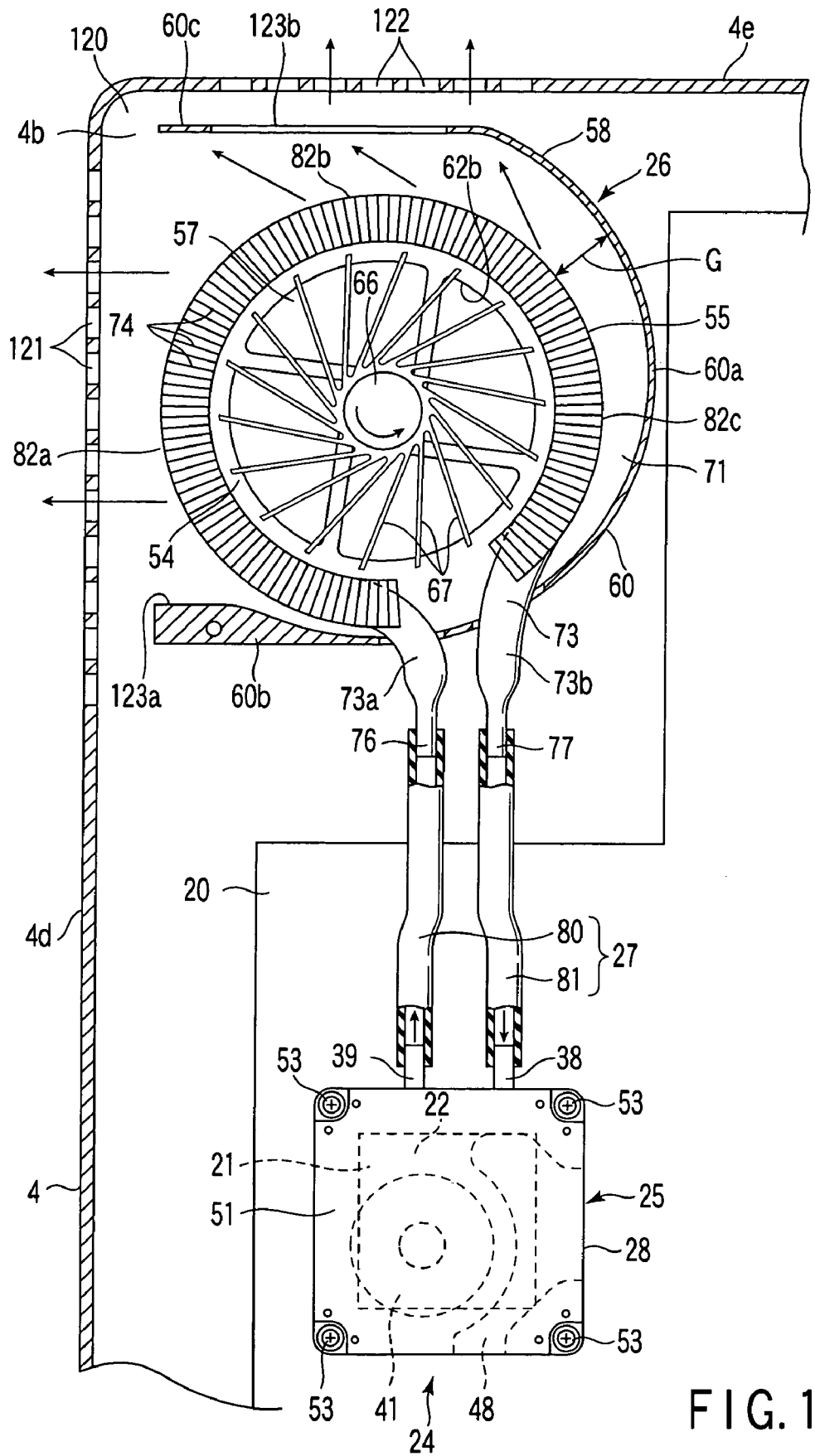
FIG. 16 is a partly sectional, plan view of the cooling unit incorporated in a fourth embodiment of this invention.

FIG. 16 illustrates a fourth embodiment of this invention.

The fourth embodiment differs from the first embodiment in the direction in which the cooling air is discharged from the radiator 26. The fourth embodiment is identical to the first embodiment in any other structural respects. Thus, the components identical to those of the first embodiment are designated at the same reference numerals and will not be described.

As FIG. 16 shows, the first housing 4 has a corner 120 that is defined by the left side wall 4d and the rear wall 4e. The left side wall 4d has a plurality of first exhaust ports 121. The first exhaust ports 121 are spaced apart in the direction of depth of the first housing 4. The rear wall 4e has a plurality of second exhaust ports 122. The second exhaust ports 122 are spaced apart in the widthwise direction of the first housing 4.

The CPU 21 mounted on the printed circuit board 20 is located in front of the corner 120. The pump unit 25 is thermally coupled to the CPU 21. The inlet pipe 38 and outlet pipe 39 of the pump housing 28 project toward the corner 120.

The radiator 26 is provided in the corner 120 of the first housing 4. The main body 58 of the radiator 26 has a pair of outlet ports 123a and 123b. These ports 123a and 123b are made in the curved wall 60 of the main body 58.

The outlet port 123a is positioned between the distal end of the second part 60b and the distal end of the third part 60c. The outlet port 123a has an opening that is elongated in the direction of depth of the first housing 4; it opens to the first exhaust ports 121 of the left side wall 4d. The other outlet port 123b is made in the third part 60c of the curved wall 60 and elongated in the widthwise direction of the first housing 4. The outlet port 123b is adjacent to the outlet port 123a and extends at right angles to the outlet port 123a. The outlet port 123b opens to the second exhaust ports 122 of the rear wall 4e.

The first heat-radiating region 82a of the coolant passage 73 extends from the second part 60b of the curved wall 60 toward the outlet port 123a and faces this outlet port 123a. The second heat-radiating region 82b of the coolant passage 73 is located in that part of the spiral chamber 71, where the gap G between the impeller 57 and the curved wall 60 is broadest. The second heat-radiating region 82b is opposed to the outlet port 123b. The third heat-radiating region 82c of the coolant passage 73 faces the first part 60a of the curved wall 60.

In the fourth embodiment, too, the impeller 57 applies air from its outer circumference in its radial direction when it is rotated in the radiator 26. The air thus applied is cooling air, which flows through the gaps between the heat-radiating fins 74 and cools the heat-radiating member 55.

The case 56 that contains the impeller 57 and heat-radiating member 55 has two outlet ports 123a and 123b, which are located adjacent to each other. The cooling air coming through the outlet port 123a is applied from the left side of the first housing 4 via the first exhaust ports 121. On the other hand, the cooling air coming through the other outlet port 123b is applied from the rear left side of the first housing 4 via the second exhaust ports 122.

The first heat-radiating region 82a of the coolant passage 73, to which the hot liquid coolant flows first, faces the outlet port 123a of the case 56. The second heat-radiating region 82b of the coolant passage 73, which lies downstream of the first heat-radiating region 82a, faces the other outlet port 123b.

The hot liquid coolant therefore flows to the outlet port 123a and to the outlet port 123b after it has been guided into the coolant passage 73. As a result, the air that has cooled the first heat-radiating region 82a and second heat-radiating region 82b is discharged from the first housing 4 through the first exhaust ports 121 and second exhaust ports 122, without flowing in the case 56.

Thus, the influence that the heat at the coolant passage 73 may impose on the case 56 can be minimized. This helps to enhance the heat-radiating efficiency of the radiator 26.

Figure 17:
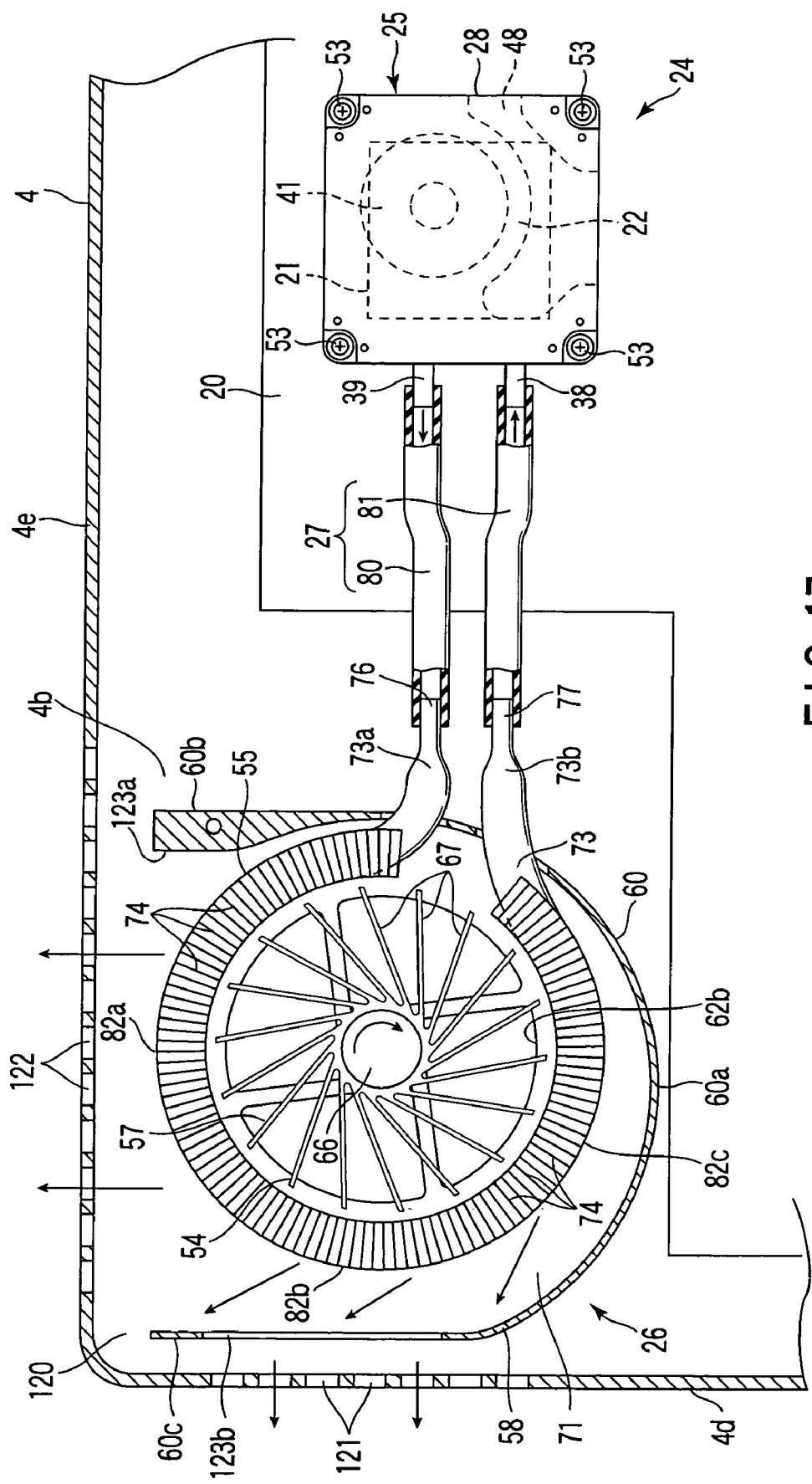
FIG. 17 is a partly sectional, plan view of the cooling unit provided in a fifth embodiment of the present invention.

FIG. 17 shows a fifth embodiment of the present invention.

The fifth embodiment is different from the fourth embodiment in the position of the CPU 21 and the orientation of the cooling unit 24. The fifth embodiment is identical to the fourth embodiment in any other structural respects. Thus, the components identical to those of the fourth embodiment are designated at the same reference numerals and will not be described.

As FIG. 17 shows, the CPU 21 mounted on the printed circuit board 20 is located on the right side of the corner 120. The pump housing 28 of the pump unit 25 is thermally coupled to the CPU 21. The inlet pipe 38 and outlet pipe 39 of the pump housing 28 project toward the corner 120.

The radiator 26 is provided in the corner 120 of the first housing 4. One outlet port 123a of the radiator 26 has an opening elongated in the widthwise direction of the first housing 4 and opens to the second exhaust ports 122 of the rear wall 4e. The other outlet port 123b of the radiator 26 has an opening elongated in the direction of depth of the first housing 4 and opens the first exhaust ports 121 of side wall 4d.

In the fifth embodiment thus configured, the cooling air flowing from the radiator 26 through the outlet port 123a is discharged from the rear of the first housing 4 through the second exhaust ports 122. The cooling air flowing from the radiator 26 through the other outlet port 123b is expelled from the left side wall 4d through the first exhaust ports 121.

Of the coolant passage 73 of the radiator 26, the first heat-radiating region 82a to which the hot liquid coolant flows first is opposed to the outlet port 123a of the case 56. The second heat-radiating region 82b that lies downstream of the first heat-radiating region 82a is opposed to the other outlet port 123b of the case 56.

The hot liquid coolant therefore flows to the outlet port 123a and to the outlet port 123b after it has been guided into the coolant passage 73. As a result, the air that has cooled the first heat-radiating region 82a and second heat-radiating region 82b is discharged from the first housing 4, first through the outlet ports 123a and 123b and then through the first exhaust ports 121 and second exhaust ports 122, without flowing in the case 56, after it has cooled the first and second heat-radiating regions 82a and 82b, i.e., the high-temperature regions of the coolant passage 73. This can minimize the influence that the heat at the coolant passage 73 may impose on the case 56, as in the fourth embodiment.

Figure 18:
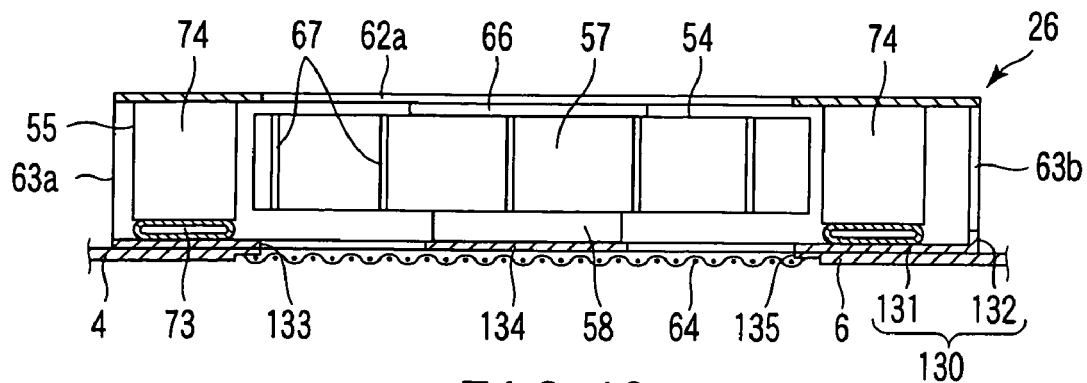
FIG. 18 is a sectional view of the radiator provided in a sixth embodiment of the invention.

FIG. 18 illustrates a sixth embodiment of the present invention.

The sixth embodiment is characterized in that the case 130 of the radiator 26 is a component not integral with the first housing 4. The sixth embodiment is identical to the first embodiment in any other structural respects. Therefore, the components identical to those of the first embodiment are designated at the same reference numerals and will not be described.

The case 130 of the radiator 26 is made of metal material that excels in thermal conductivity, such as aluminum alloy. As FIG. 18 depicts, the case 130 has a bottom wall 131 and side walls 132. The bottom wall 131 has an inlet port 133 and a motor support 134. The motor support 134 is provided inside the inlet port 133. The motor support 134 supports a motor 68, to which an impeller 57 is connected. The impeller 57 is located between the inlet ports 62a and 133. The bottom wall 131 is fastened to the inner surface of the bulging part 6 by means of, for example, screws. The inlet port 133 of the bottom wall 131 communicates with an opening 135 made in the bottom of the bulging part 6. The opening 135 is covered with a guard 64.

The side walls 132 stand upright from the edges of the bottom wall 131 and surround the impeller 57. Of the side walls 132, two opposite walls have an outlet port 63a and an outlet port 63b, respectively. The outlet ports 63a and 63b face each other across the impeller 57.

The coolant passage 73 in which liquid coolant flows is laid on the bottom wall 131. The coolant passage 73 is therefore thermally coupled to the case 130.

Figure 19:
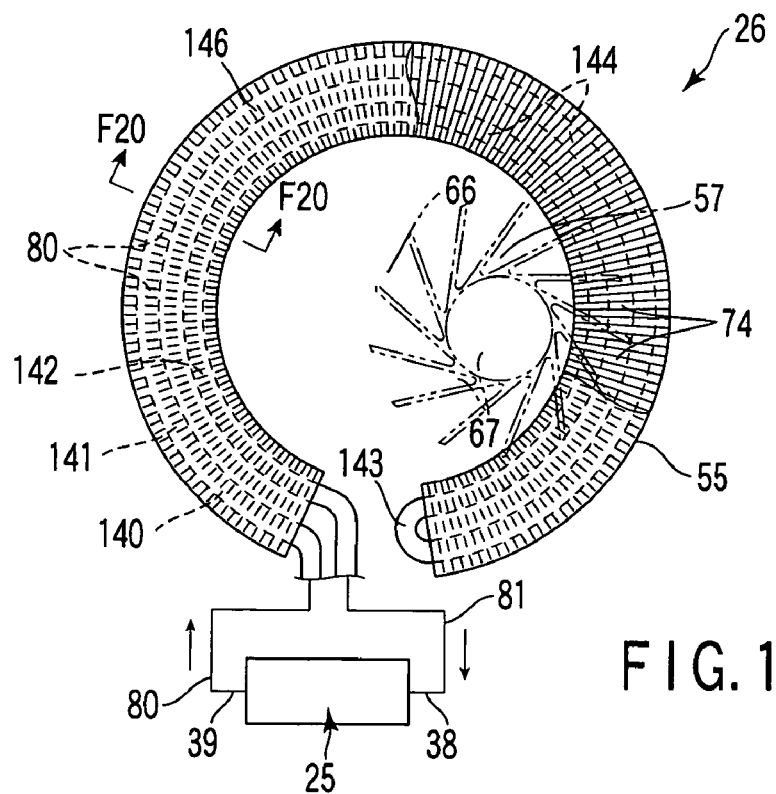
FIG. 19 is a plan view of the heat-radiating member used in a seventh embodiment of this invention.
Figure 20:
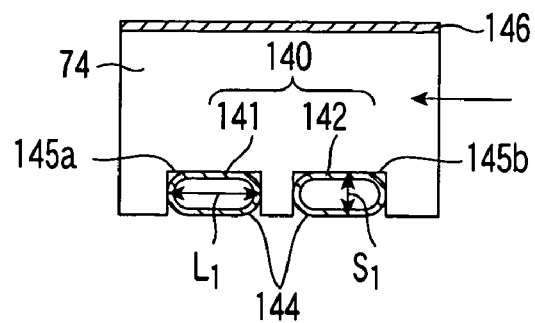
FIG. 20 is a sectional view, taken along line F20-F20 in FIG. 19.

FIG. 19 and 20 show a seventh embodiment of this invention.

The seventh embodiment differs from the first embodiment, mainly in the shape of the coolant passage 140 of the heat-radiating member 55.

As FIG. 19 shows, the coolant passage 140 has three passages 141, 142 and 143. The first passage 141 and the second passage 142 extend parallel to each other, from one end of the heat-radiating member 55 to the other end thereof. The third passage 143 connects the downstream end of the first passage 141 to the upstream end of the second passage 142.

The first passage 141 and the second passage 142 are arched, each surrounding the impeller 57. The first passage 141 surrounds the second passage 142.

The upstream end of the first passage 141 and the downstream end of the second passage 142 protrude from one end of the heat-radiating member 55, in parallel to each other. The third passage 143 lies between the ends of the heat-radiating member 55. The first passage 141 is connected at the upstream end to the outlet pipe 39 of the pump unit 25 by the first tube 80. The second passage 142 is connected at the downstream end to the inlet pipe 38 of the pump unit 25 by the second tube 81.

The passages 141, 142 and 143 are pipes 144 that have a flat cross section. As seen from FIG. 20, the cross section of each pipe 144 has a major axis L1 and a minor axis S1. The major axis L1 extends in the lengthwise direction of the heat-radiating fins 74. The minor axis S1 extends in the direction of height of the heat-radiating fins 74.

Each heat-radiating fin 74 has two U-shaped first and second notches 145a and 145b. The notches 145a and 145b are spaced apart in the lengthwise direction of the fin 74. The first passage 141 is fitted in the first notch 145a of each fin 74 and soldered to the lower edge of the fin 74. The second passage 142 is fitted in the second notch 145b of each fin 74 and soldered to the lower edge of the fin 74. Thus, the first passage 141 and the second passage 142 are thermally connected to the heat-radiating fins 74.

A connection plate 146 that is curved like an arc is soldered to the upper edges of the heat-radiating fins 74. The heat-radiating fins 74 are coupled to one another by the first passage 141, second passage 142 and connection plate 146. The fins 74 are thereby spaced from one another by a predetermined distance.

In the seventh embodiment thus constructed, the liquid coolant heated by virtue of heat exchange in the pump housing 28 is pumped into the first passage 141 of the coolant passage 140. After reaching the downstream end of the first passage 141, the liquid coolant flows into the second passage 142 through the third passage 143. Finally, the liquid coolant reaches the downstream end of the second passage 142. As the liquid coolant so flows, the heat that the coolant has absorbed from the IC chip 23 is transferred from the pipes 144 to the heat-radiating fins 74.

In other words, the liquid coolant guided from the pump housing 28 to the coolant passage 140 flows from one end of the heat-radiating member 55 to the other end thereof, and flows from the other end of the member 55 to the first-mentioned end thereof. This means that the coolant passage 140 is twice as long as the heat-radiating member 55 is. Heat is transmitted to each heat-radiating fin 74 from both the first passage 141 and the second passage 142.

In addition, the first passage 141 is fitted in the first notch 145a of each fin 74, and the second passage 142 is fitted in the second notch 145b of each fin 74. Thus, each heat-radiating fin 74 contacts the first and second passage 141 and 142 at a large area. Heat is therefore efficiently transmitted to the heat-radiating fins 74 from the liquid coolant flowing in the first and second passages 141 and 142.

As a result, the surface temperature of the heat-radiating fins 74 rises. That is, heat is readily transmitted to every part of each heat-radiating fin 74. The heat of the liquid coolant can be efficiently radiated from the heat-radiating fins 74. The radiator 26 can thus radiate heat at high efficiency.

In the seventh embodiment, the first passage 141 into which the liquid coolant heated flows first surrounds the second passage 142. The cooling air applied from the outer circumference of the impeller 57 passes first through the junction of each fin 74 and the second passage 142 and then though the unction of each fin 74 and the first passage 141, as indicated by the arrow shown in FIG. 20.

The liquid coolant has been cooled to some degree in the first passage 141 by virtue of heat exchange at the heat-radiating fins 74 before it flows into the second passage 142. Since the hot liquid coolant flows into the first passage 141, the temperature at the junction between the first passage 141 and each heat-radiating fin 74 is higher than the temperature at the junction between the second passage 142 and each heat-radiating fin 74.

In the seventh embodiment, the junctions between the first passage 141 and the heat-radiating fins 74 lie more downstream of the cooling air than the junctions between the second passage 142 and the heat-radiating fins 74. Hence, the cooling air that has passed through the junctions between the first passage 141 and the heat-radiating fins 74 and is hot is not guided to the cooling air than the junctions between the second passage 142 and the heat-radiating fins 74. Therefore, the hot cooling air would not influence the second passage 142.

This prevents the liquid coolant returning from the radiator 26 to the pump unit 25 from being heated to high temperature.

FIGS. 21 to 25 show an eighth embodiment of this invention.

The eighth embodiment differs from the first embodiment, mainly in the shape of the coolant passage 160 of the heat-radiating member 55.

Figure 21:
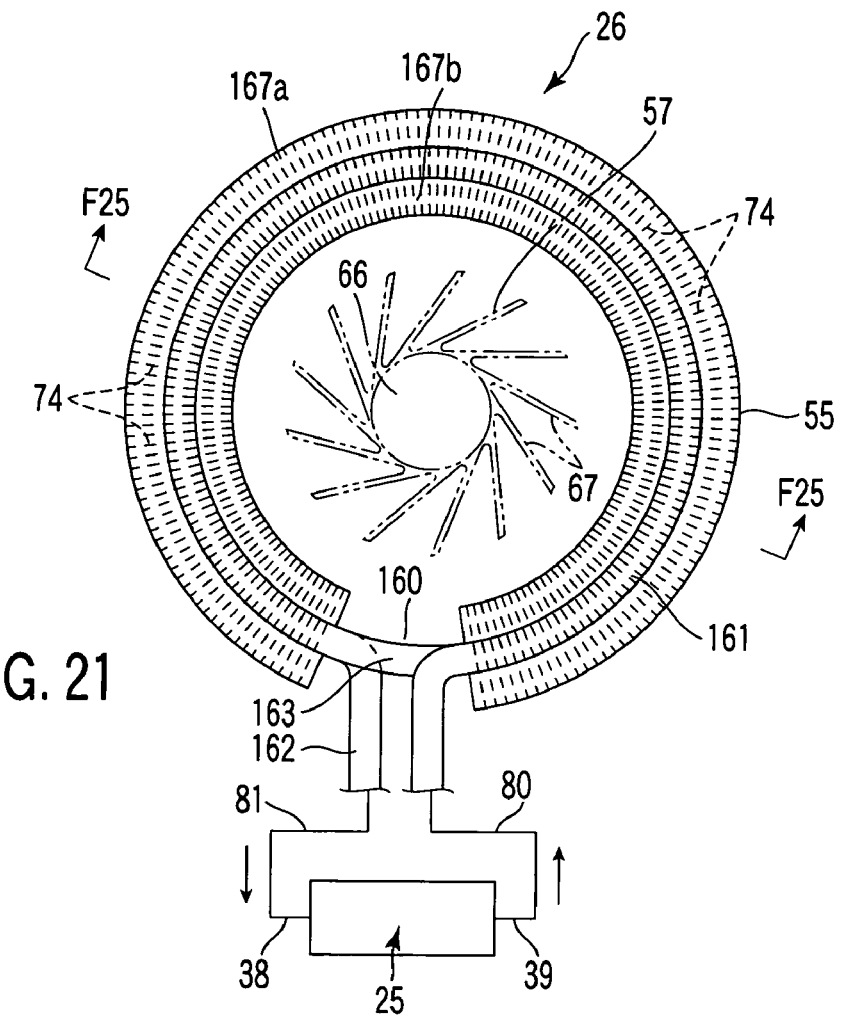
FIG. 21 is a plan view of the heat-radiating member used in an eighth embodiment of the present invention.
Figure 22:
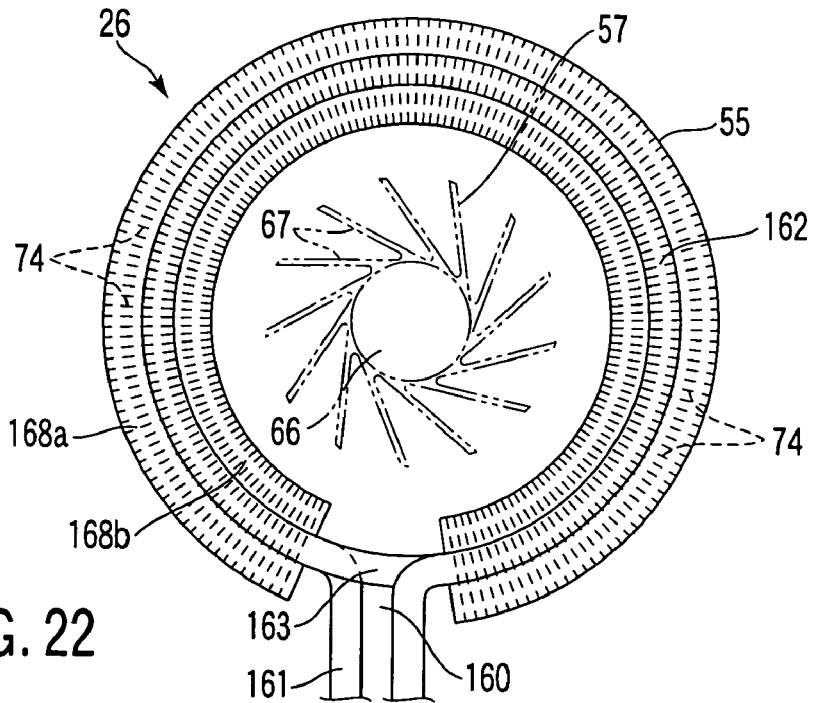
FIG. 22 is a bottom view of the heat-radiating member used in the eighth embodiment of the invention.

As shown in FIGS. 21 to 23, the coolant passage 160 has three passages 161 to 163 through which liquid coolant flows. The first to third passages 161 to 163 are constituted by one pipe that has a flat cross section.

The first passage 161 is curved like an arc, surrounding the impeller 57 and extending between the upper edges of the heat-radiating fins 74. The upstream end of the first passage 161 is located at one end of the heat-radiating member 55. The downstream end of the first passage 161 is located at the other end of the heat-radiating member 55. The first tube 80 connects the upstream end of the first passage 161 to the outlet pipe 39 of the pump unit 25. As FIG. 25 depicts, the first passage 161 is fitted in the notch 165 cut in the upper edge of each heat-radiating fin 74 and is soldered to the upper edge thereof.

The second passage 162 is curved like an arc, surrounding the impeller 57 and extending between the lower edges of the heat-radiating fins 74. The upstream end of the second passage 162 is located at one end of the heat-radiating member 55. The downstream end of the second passage 162 is located at the other end of the heat-radiating member 55. The second tube 81 connects the downstream end of the second passage 162 to the inlet pipe 38 of the pump unit 25. As FIG. 25 shows, the second passage 162 is fitted in the notch 166 cut in the lower edge of each heat-radiating fin 74 and is soldered to the lower edge thereof.

The third passage 163 extends from one end of the heat-radiating member 55 to the other end thereof. The third passage 163 inclines in the direction of height of the heat-radiating fins 74, connecting the downstream end of the first passage 161 and the upstream end of the second passage 162.

A pair of first connection plates 167a and 167b are soldered to the upper edge of each heat-radiating fin 74. Both connection plates 167a and 167b are curved like an arc. Similarly, a pair of second connection plates 168a and 168b are soldered to the lower edge of each heat-radiating fin 74. Both connection plates 168a and 168b are curved like an arc, too. Thus, the first passage 161, second passage 162 and connection plates 167a, 167b, 168a and 168b connect the heat-radiating fins 74 and spaced apart, one from another by a predetermined distance.

In the eighth embodiment described above, the liquid coolant heated in the pump housing 28 first flows into the first passage 161. The coolant then flows, across the upper edges of the heat-radiating fins 74. After reaching the downstream end of the first passage 161, the liquid coolant flows into the second passage 162 through the third passage 163. The coolant further flows, across the lower edges of the heat-radiating fins 74. As the liquid coolant so flows, heat is transmitted from the liquid coolant to the heat-radiating fins 74.

In the eighth embodiment, the liquid coolant pumped from the pump housing 28 into the radiator 26 flows first through the first passage 141 and then through the second passage 142. Since the first and second passage 141 and 142 surround the impeller 57, the liquid coolant flows twice around the impeller 57. This means that the coolant passage 160 is twice as long as the heat-radiating member 55 is. Heat is transmitted to each heat-radiating fin 74 from both the first passage 161 and the second passage 162.

Additionally, the first passage 161 is fitted in the notch 165 that is cut in the upper edge of each fin 74, and the second passage 162 is fitted in the notch 166 that is cut in the lower edge of each fin 74. Each heat-radiating fin 74 therefore contacts the first and second passage 161 and 162 at a large area. Heat is efficiently transmitted to the heat-radiating fins 74 from the liquid coolant flowing in the first and second passages 161 and 162.

As FIG. 23 shows, the third passage 163 inclines downward from the downstream end of the first passage 161 to the upstream end of the second passage 162. The liquid coolant therefore flows downwards in the third passage 163. It is unnecessary to pump up the liquid coolant against the force of gravity. This reduces the resistance to the liquid coolant flowing in the first to third passage 161, 162 and 163.

Hence, the workload on the pump unit 25 that forces out the liquid coolant decreases. The liquid coolant can be circulated between the pump unit 25 and the radiator 26, without being exerted with a great drive force.

The present invention is not limited to the embodiments described above. Rather, various changes and modifications can be made without departing from the scope and spirit of the invention.

For example, the case has two outlet ports in any embodiment described above and cooling air is discharged in difference directions. Nevertheless, the case may have only one outlet port.

Furthermore, the heat generating component is not limited to a CPU. It may be, for example, a chip set. The housing that contains the cooling unit is not limited to one made of metal. The housing may be made of synthetic resin in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling unit comprising:
   a heat receiving portion which is thermally connected to a heat generating component;
   a heat radiating portion which radiates heat from the heat generating component; and
   a circulation path through which liquid coolant is circulated between the heat receiving portion and the heat radiating portion,
   wherein the heat radiating portion has:
   an impeller which expels cooling air in a radial direction from an outer circumference thereof;
   a heat-radiating member which includes a coolant passage in which the liquid coolant flows, and a plurality of heat-radiating fins thermally connected to the coolant passage, the coolant passage being provided downstream of the impeller with respect to flow of the cooling air and surrounding the outer circumference of the impeller, the cooling air expelled from the outer circumference of the impeller flowing between the heat-radiating fins to cool the heat-radiating member; and
   a case which contains the impeller and the heat-radiating member and which has at least one outlet port through which the cooling air is expelled after cooling the heat-radiating member.

2. The cooling unit according to claim 1, wherein the heat receiving portion has a pump which forces out the liquid coolant.

3. The cooling unit according to claim 2, wherein the circulation path has a first tube which connects the pump to the coolant passage and a second tube which connects the coolant passage to the pump.

4. The cooling unit according to claim 1, wherein the circulation path has a pump which forces out the liquid coolant.

5. The cooling unit according to claim 1, wherein the case has a spiral chamber in which the cooling air is collected after discharged from the impeller, and the coolant passage and the heat-radiating fins are arranged in the spiral chamber.

6. The cooling unit according to claim 1, wherein the heat-radiating fins are thermally connected to the case.

7. The cooling unit according to claim 1, wherein the circulation path includes a first tube which guides the liquid coolant heated in the heat receiving portion to the coolant passage, a second tube which guides the liquid coolant cooled while flowing through the coolant passage to the heat receiving portion and a pump which is provided in the first tube or the second tube and forces out the liquid coolant.

8. The cooling unit according to claim 1, wherein the heat-radiating member is located between the outer circumference of the impeller and outlet port of the case.

9. The cooling unit according to claim 1, wherein the coolant passage is a pipe having a flat cross section.

10. The cooling unit according to claim 9, wherein the coolant passage includes a coolant inlet port, a coolant outlet port, and heat-radiating regions, wherein the heat-radiating regions have a flat cross section.

11. The cooling unit according to claim 1, wherein the coolant passage substantially entirely surrounds the outer circumference of the impeller.

12. An electronic apparatus comprising:
   a housing which has an exhaust port and which contains a heat generating component; and a cooling unit which is contained in the housing and uses liquid coolant to cool the heat-generating component and which includes a heat receiving portion which is thermally connected to the heat generating component, a heat radiating portion which radiates heat from the heat generating component, and a circulation path through which liquid coolant is circulated between the heat receiving portion and the heat radiating portion, wherein the heat radiating portion comprises:
- (i) an impeller which expels cooling air in a radial direction from an outer circumference thereof;
- (ii) a heat-radiating member which includes a coolant passage in which the liquid coolant heated by heat exchange with the heat-generating component flows, and a plurality of heat-radiating fins thermally connected to the coolant passage, the coolant passage being provided downstream of the impeller with respect to flow of the cooling air and surrounding the outer circumference of the impeller, the cooling air expelled from the outer circumference of the impeller flowing between the heat-radiating fins to cool the heat-radiating member; and
- (iii) a case which contains the impeller and the heat-radiating member and which has at least one outlet port through which the cooling air is expelled after cooling the heat-radiating member.

13. The electronic apparatus according to claim 12, wherein the outlet port of the case face the exhaust port of the housing, respectively.

14. The electronic apparatus according to claim 12, wherein the case has a curved wall which surrounds the heat-radiating fins and which is integrally formed with the housing.

15. The electronic apparatus according to claim 12, wherein the housing has a bottom wall which has the exhaust port and an inlet port for guiding cooling air to a center of rotation of the impeller.

16. The electronic apparatus according to claim 12, wherein the impeller expels cooling air from the outer circumference thereof toward the heat-radiating member.

17. The cooling unit according to claim 12, wherein the coolant passage substantially entirely surrounds the outer circumference of the impeller.

18. An electronic apparatus comprising:
- a housing which has an exhaust port and which contains a heat generating component;
- a heat receiving portion which is thermally connected to the heat generating component;
- a heat radiating member which radiates heat from the heat generating component, the heat radiating member including a coolant passage through which a liquid coolant flows, the coolant passage being thermally connected to the heat radiating member;
- a circulation path through which the liquid coolant is circulated between the heat receiving portion and the coolant passage of the heat radiating member;
- an impeller having an outer circumference which expels cooling air, the outer circumference being surrounded with the coolant passage of the heat radiating member, the coolant passage being provided downstream from the impeller along a flow direction of the cooling air; and
- a case which includes an inlet port and an outlet port facing the exhaust port, and in which contains the impeller and the coolant passage of the heat radiating member.

19. The electronic apparatus according to claim 18, wherein the heat radiating member is contained in the case.

20. The electronic apparatus according to claim 18, further comprising:
- a pump which forcibly circulates the liquid coolant in the circulation path, the heat receiving portion is formed outside the pump.

21. The electronic apparatus according to claim 18, wherein the coolant passage substantially entirely surrounds the outer circumference of the impeller.

* * * * *